United States Patent [19]

Manning

[11] Patent Number: 5,956,502
[45] Date of Patent: Sep. 21, 1999

[54] METHOD AND CIRCUIT FOR PRODUCING HIGH-SPEED COUNTS

[75] Inventor: Troy A. Manning, Meridian, Id.

[73] Assignee: Micron Technology, Inc., Boise, Id.

[21] Appl. No.: 08/812,878

[22] Filed: Mar. 5, 1997

[51] Int. Cl.$^6$ .................................................. G06F 1/04
[52] U.S. Cl. ........................................................ 395/557
[58] Field of Search .................................. 395/557, 559; 377/54, 64, 111

[56] References Cited

U.S. PATENT DOCUMENTS

| | | | |
|---|---|---|---|
| 4,095,093 | 6/1978 | Miles | 377/26 |
| 4,096,402 | 6/1978 | Schroeder et al. | 307/362 |
| 4,404,474 | 9/1983 | Dingwall | 307/260 |
| 4,611,337 | 9/1986 | Evans | 377/123 |
| 4,638,187 | 1/1987 | Boler et al. | 307/451 |
| 4,789,796 | 12/1988 | Foss | 307/443 |
| 4,958,088 | 9/1990 | Farah-Bakhsh et al. | 307/443 |
| 4,984,204 | 1/1991 | Sato et al. | 365/189.11 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 307/270 |
| 5,179,298 | 1/1993 | Hirano et al. | 307/443 |
| 5,194,765 | 3/1993 | Dunlop et al. | 307/443 |
| 5,220,208 | 6/1993 | Schenck | 307/443 |
| 5,239,206 | 8/1993 | Yanai | 307/272.2 |
| 5,254,883 | 10/1993 | Horowitz et al. | 307/443 |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,311,481 | 5/1994 | Casper et al. | 365/230.06 |
| 5,321,368 | 6/1994 | Hoelzle | 328/63 |
| 5,347,177 | 9/1994 | Lipp | 307/443 |
| 5,347,179 | 9/1994 | Casper et al. | 307/451 |
| 5,361,002 | 11/1994 | Casper | 327/530 |
| 5,390,308 | 2/1995 | Ware et al. | 395/400 |
| 5,400,283 | 3/1995 | Raad | 365/203 |
| 5,438,545 | 8/1995 | Sim | 365/189.05 |

(List continued on next page.)

FOREIGN PATENT DOCUMENTS

| | | |
|---|---|---|
| 0 450 871 A2 | 10/1991 | European Pat. Off. . |
| 0 655 741 A2 | 5/1995 | European Pat. Off. . |
| 0 680 049 A2 | 11/1995 | European Pat. Off. . |
| 0 692 872 A2 | 1/1996 | European Pat. Off. . |
| 2-112317 | 4/1990 | Japan . |
| 4-135311 | 8/1992 | Japan . |
| 5-136664 | 1/1993 | Japan . |
| 5-282868 | 10/1993 | Japan . |

OTHER PUBLICATIONS

Taguchi, M. et al., "A 40–ns 64–Mb DRAM with 64–b Parallel Data Bus Architecture", IEEE Journal of Solid–State Circuits, vol. 26, Nov. 1991, pp. 1493–1497.

Descriptive literature entitled, "400 MHz SLDRAM, 4M x 16 SLDRAM Pipelined, Eight Bank, 2.5 V Operation", pp. 1–22.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

*Primary Examiner*—Thomas M. Heckler
*Attorney, Agent, or Firm*—Seed and Berry LLP

[57] ABSTRACT

A counter circuit includes a series of registers driven by two phase shifted clocks. A clock generator in the counter circuit generates four asymmetrical clock signals to drive each of the registers. The registers are formed from input and output stages, each having two sets of switches. The first set of switches in each stage provides a supply voltage to a stage output in response to the asymmetrical clocks. The second set of switches supply ground to the stage output in response to the asymmetrical clocks. To accelerate response of the switching circuits, isolation switches decouple the first set of switches in each pair from the stage output during switching of the second set of switches, thereby removing loading of stage output by the second set of switches.

65 Claims, 13 Drawing Sheets

U.S. PATENT DOCUMENTS

| | | | |
|---|---|---|---|
| 5,440,260 | 8/1995 | Hayashi et al. | 327/278 |
| 5,457,407 | 10/1995 | Shu et al. | 326/30 |
| 5,473,575 | 12/1995 | Farmwald et al. | 365/230.06 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farmwald et al. | 395/309 |
| 5,568,077 | 10/1996 | Sato et al. | 327/199 |
| 5,574,698 | 11/1996 | Raad | 365/230.06 |
| 5,576,645 | 11/1996 | Farwell | 327/94 |
| 5,578,941 | 11/1996 | Sher et al. | 326/34 |
| 5,581,197 | 12/1996 | Motley et al. | 326/30 |
| 5,590,073 | 12/1996 | Arakawa et al. | 365/185.08 |
| 5,619,473 | 4/1997 | Hotta | 365/238.5 |
| 5,621,690 | 4/1997 | Jungroth et al. | 365/200 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,655,105 | 8/1997 | McLaury | 395/496 |
| 5,668,763 | 9/1997 | Fujioka et al. | 365/200 |
| 5,682,342 | 10/1997 | Suzuki | 367/770 |
| 5,694,065 | 12/1997 | Hamasaki et al. | 327/108 |
| 5,831,929 | 11/1998 | Manning | 365/233 |

| CNT | 800MHz | 400 MHz |
|---|---|---|
| 0 | * LATCH ROW ADDRESS | |
| 16 | | |
| 32 | | |
| 48 | DECODE ROW | |
| 64 | | |
| 80 | PRECHARGE ROW | * |
| 96 | | LATCH ROW ADDRESS |
| 112 | DECODE COL. ADDRESS | |
| 128 | | DECODE ROW |
| 144 | ENABLE SENSE AMPS | PRECHARGE ROW |
| 160 | | |
| 176 | | DECODE COL. ADDRESS |
| 192 | ENABLE ROW | ENABLE SENSE AMPS |
| 208 | | |
| 224 | CONNECT DATA PATH | ENABLE ROW |
| 240 | | CONNECT DATA PATH |
| 256 | | |

*Fig. 2*

| C(REG2) | C(REG1) | A | B |
|---|---|---|---|
| 0 | 0 | 1 | 0 |
| 0 | 1 | 0 | 0 |
| 1 | 0 | 1 | 0 |
| 1 | 1 | 1 | 1 |

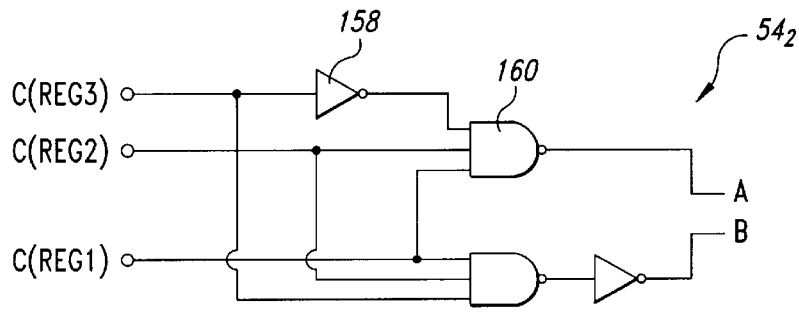
*Fig. 11A*
| C(REG3) | C(REG2) | C(REG1) | A | B |
|---|---|---|---|---|
| 0 | 0 | 0 | 1 | 0 |
| 0 | 0 | 1 | 1 | 0 |
| 0 | 1 | 0 | 1 | 0 |
| 0 | 1 | 1 | 0 | 0 |
| 1 | 0 | 0 | 1 | 0 |
| 1 | 0 | 1 | 1 | 0 |
| 1 | 1 | 0 | 1 | 0 |
| 1 | 1 | 1 | 1 | 1 |
*Fig. 11B*
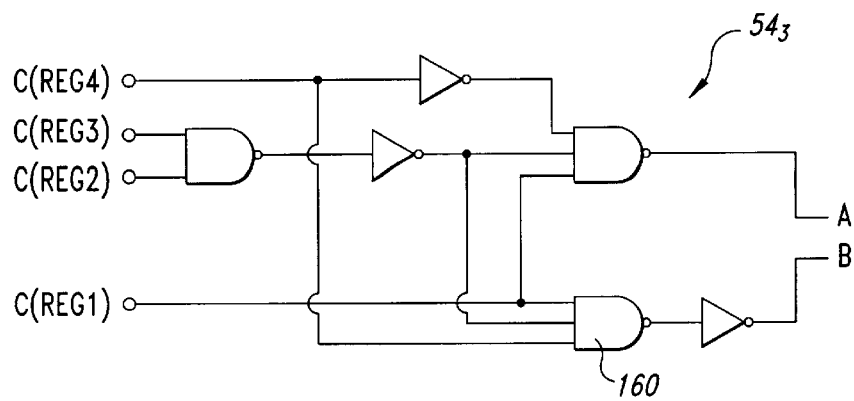
*Fig. 12*

METHOD AND CIRCUIT FOR PRODUCING HIGH-SPEED COUNTS

TECHNICAL FIELD

The present invention relates to integrated circuit devices, and more particularly to counter circuits in integrated devices.

BACKGROUND OF THE INVENTION

In the operation of memory devices, such as packetized dynamic random access memories ("DRAMs"), conventional DRAMs and other packetized memory devices, specific functions must occur in a predetermined sequence. These functions are generally performed responsive to respective command signals issued by a command generator, such as a memory controller. The timing of the command signals is generally controlled by a clock signal either registered to an edge of the clock signal or occurring a predetermined time after an edge of the clock signal. The rate at which the memory device may process commands is limited by the amount of time it takes to perform functions responsive to the commands. For most functions, the minimum times to perform the functions are specified by the manufacturer of the memory device. However, since the commands are generally issued responsive to clock signals, the amount of time that the memory device has to perform its functions is controlled by the clock speed. For example, as illustrated in FIG. 1A, a memory read command 10 is issued by a memory controller and is registered with a clock signal 12 at time $t_0$. As further shown in FIG. 1A, completing the read operation requires four clock cycles, because of the many operations that must occur in a memory device before data can be read from the memory device. Thus, a data bit 14 is not present on the data bus until time $t_1$. The elapsed time from issuing the read command 10 to the complete processing of the command by applying the data bit 14 to the data bus is therefore $\alpha t_a$. The elapsed time could be reduced by increasing the speed of the clock 12. However, regardless of the speed of the clock, the memory device requires a certain minimum time to complete its functions. Speeding the clock up beyond that point will not reduce the amount of time required to perform those functions.

Although memory devices operate at optimum speed when the clock is at or near its maximum speed, they operate at far from optimum speed responsive to slower clock speeds. With reference to FIG. 1B, a clock signal 20 has a speed or frequency only half that of the clock signal 12 in FIG. 1A. Once again, a read command 22 is registered with the clock signal 20 at time $t_0$, and a data bit 24 is applied to the data bus four clock cycles later. However, because of the slower speed clock signal 20, the data bit 24 is not applied to the data bus until $t_2$. As a result of the slower clock speed, the elapsed time between issuing of the read command 22 and complete processing of the command is $\Delta t_b$, which is twice the duration of $\alpha t_a$. Thus, by employing a fixed relationship between a clock signal and the issuing of command signals, conventional memory devices often operate at far from optimum speed when they receive a relatively slow clock signal.

It will be understood by one skilled in the art that the timing diagrams of FIGS. 1A and 1B omit a large number of other signals applied to the memory device. These signals have been omitted for purposes of brevity. Also, one skilled in the art will understand that the command signals 10, 22 may be composed of a combination of other signals in a conventional DRAM or may be control data in a data packet in a packetized memory system. In either case, the combination of signals or control data are commonly referred to as simply a command. The exact nature of the signals or control data will depend on the nature of the memory device, but the principle explained above is applicable to many types of memory devices, including asynchronous DRAMs, synchronous DRAMs, packetized DRAMs and other packetized memory devices. Also, although the problem resulting from issuing command signals according to a fixed relationship with the clock signal has been explained with reference to memory devices, the principles described herein are applicable to other integrated circuits that utilize counters or related switching signals responsive to a clock signal.

SUMMARY OF THE INVENTION

A high-speed counter circuit produces a digital count with a plurality of bits to control timing of operations in a memory device. In one embodiment, the counter circuit includes a pair of input clock terminals that receive first and second clock signals. The second clock signal is phase shifted by 90° relative to the first clock signal.

A clock converter converts the two input clock signals to four asymmetric clock signals that control timing within the counter circuit. The asymmetric clock signals drive a bank of eight registers, where each register provides one bit of the count. The state of each bit is controlled by a respective pair of blocking signals provided to the register by a respective logic circuit. The outputs of each of the registers is fed back to the respective logic circuit, so that each bit is controlled in part by its preceding state.

The first register provides the least significant bit to the second register's logic circuit in response to the clock signals. In response to the least significant bit and the fed back bit from the second register output, the first logic circuit activates the second register to provide the second least significant bit. The second logic circuit receives the second least significant bit and activates the third register. The third through eighth registers provide the third least significant bit through the most significant bit in response to outputs from corresponding logic circuits driven by preceding registers. Since the first register has no logic circuit, the first register responds more quickly than the other logic circuits. The least significant bit from the first register is also the last bit to transition to establish transition conditions at the logic circuit of the other registers. Therefore, to accelerate the response of the series of registers, the least significant bit from the first register is fed forward in a bypass circuit to the logic circuit each of the subsequent registers.

One input of each of the logic circuits has a shorter response time than the logic circuit's other inputs. Thus, to further accelerate the response of the counter, the fed forward signal is applied to the inputs of the logic circuits that have the shortest response time.

Each of the registers is formed from an input stage and an output stage linked by an intermediate latch. The input stage receives the four asymmetric clock signals and a pair of blocking signals from its corresponding logic circuit. The input stage includes a supply gate and a first blocking switch serially coupled between a supply voltage and a switching node. The input stage also includes a reference gate and a second blocking switch coupled between a reference voltage and the switching node. During activation of one of the gates, the other gate is isolated from the switching node by the corresponding blocking switch to prevent the gate from loading the switching node. The voltage of the switching node drives the intermediate latch to provide a latched clocking output to the output stage.

The output stage includes a first pair of multiplexing transistors and a first isolation switch serially coupled between the supply voltage and an output node. Additionally, the output stage includes a second pair of multiplexing transistors and a second isolation switch coupled between the reference voltage and the output node. The first and second isolation switches are complementary switches that receive the output of the intermediate latch. In response to the intermediate latch output, one of the isolation switches is ON and one of the switches is OFF. The ON isolation switch allows its respective pair of multiplexing transistors to control the output node voltage. The OFF switch isolates the output node from its respective multiplexing transistors to prevent capacitance of the respective multiplexing transistors from loading the output node.

BRIEF DESCRIPTION OF THE DRAWINGS

FIG. 2 is a chart illustrating a basic concept of sequencing operations in a memory device according to counts.

FIG. 11A is a schematic of a second logic circuit for producing blocking signals for the third register of the counter circuit of FIG. 4.

FIG. 11B is a truth table showing inputs to and outputs from the logic circuit of FIG. 11A.

FIG. 12 is a schematic of a third logic circuit for producing blocking signals for the fourth register of the counter circuit of FIG. 4.

DETAILED DESCRIPTION OF THE INVENTION

Figure 1A:
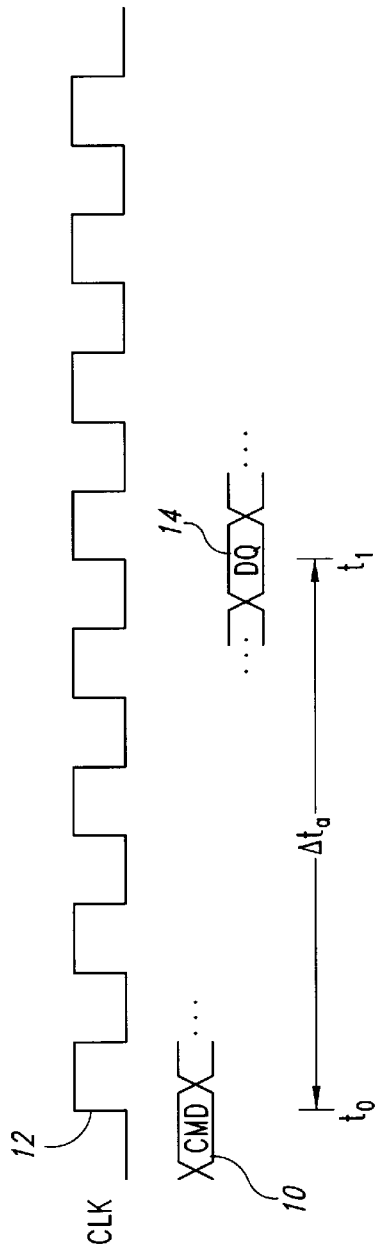
FIGS. 1A and 1B are timing diagrams illustrating the relationship between clock signals and the processing of commands in a conventional dynamic random access memory.
Figure 1B:
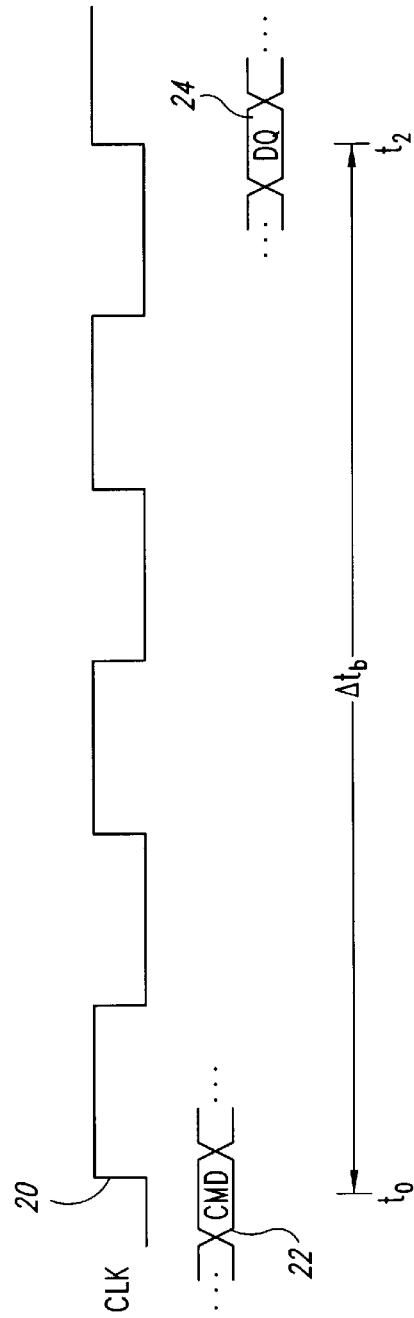

Before describing a preferred embodiment of a memory device 40 (FIG. 3) according to the invention, the general theory of operation of timing control and use of counts by the memory device 40 will be explained with reference to FIG. 2. FIG. 2 is a diagram representing the status of a counter 50 (described below with reference to FIGS. 4–17) and decoder in which the counter 50 increments responsive to a clock signal from an initial value of 0 to a maximum value of 255. At various counter values, the decoder issues respective command signals, some of which are shown in FIG. 2. Listed in the left-hand side of the diagram opposite their respective counter values are the command signals issued by the decoder when the frequency of the clock signal is 800 MHz. Listed in the right-hand side of the diagram in FIG. 2 opposite their respective counter values are those same command signals as they occur when the frequency of the clock signal is 400 MHz.

As shown in FIG. 2, when the clock frequency is 800 MHz, the counter begins incrementing from 0 (designated by the asterisk). An external row address is then latched at about count 16, the row address is decoded at about count 47, the row is precharged and equilibrated at about count 85, a column address is decoded at about count 120, the sense amps corresponding to the decoded column address are enabled at count 143, the addressed row is enabled at about count 190, and the data path connects the digit lines of the enabled sense amplifier to an external data bus terminal at about count 225.

As further shown in FIG. 2, these same read commands are also issued by the decoder when the clock speed is 400 MHz, except that they are issued at substantially lower count values. The external row address is then latched at about count 100, the row address is decoded at about count 120, the row is precharged and equilibrated at about count 144, an externally applied column address is decoded at about count 165, the sense amps for the column address are enabled at about count 180, the addressed row is enabled at about count 213, and the data path couples data from the digit lines of the enabled sense amplifier to the external data bus terminal at about count 225. Note that, even though the command signals listed on the right-hand side of FIG. 2 are issued at substantially lower count values, they occur at substantially the same time from the start of a memory access. Although approximately twice as many clock pulses may occur between the command signals when the clock frequency is 800 MHz as compared to 400 MHz, the command signals are nevertheless issued at the same times because of the higher clock speed. However, it should be emphasized that the timing of the command signals may not be entirely linear. For example, a command signal that may be issued at counter value 40 for a 400 MHz clock signal may not be issued at counter value 80 for an 800 MHz clock signal. However, a given command signal will normally be issued at a higher counter value for a higher clock frequency. By eliminating a fixed relationship between the number of clock cycles and the issuing of command signals, the command generator is able to issue command signals at an optimum rate for a wide variety of clock speeds.

Figure 3:
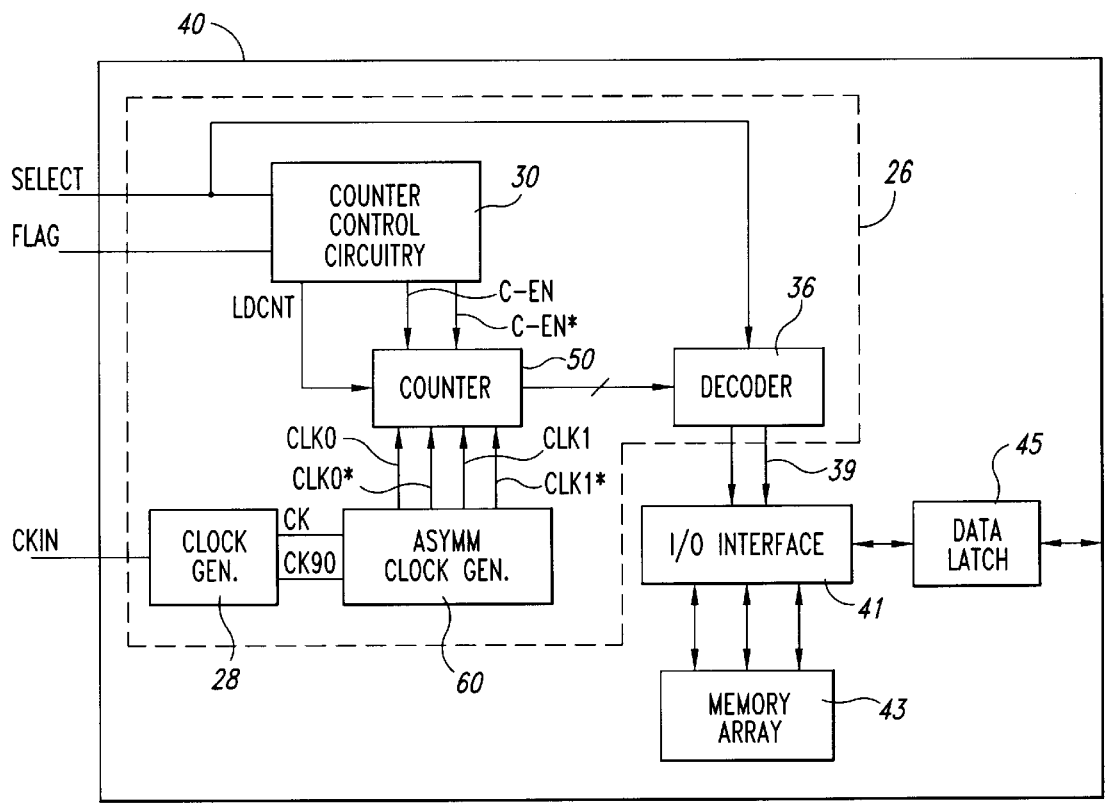
FIG. 3 is a block diagram of the memory device including a counter circuit for producing counts used in sequencing.

A block diagram of a preferred embodiment of a memory device 40 incorporating the command generator 26 is illustrated in FIG. 3. The operation of much of the command generator 26 illustrated in FIG. 3 is controlled by a clock signal CLK and a quadrature clock signal CLK 90 generated by a conventional clock circuit 28 in response to an input clock signal CKIN from a circuit (not shown) external to the memory device 40. The input clock signal CKIN may be at any of several designated frequencies of operation of the device 40, such as 100 MHz, 200 MHz . . . 800 MHz. A SELECT signal is also provided by the memory controller to indicate the frequency of the input clock signal CKIN. In response to the SELECT signal, the counter control circuitry 30 alters the operation of the command generator 26 accordingly.

Once the frequency is selected, the counter control circuitry 30 provides enable signals C-EN, C-EN* to a counter 50 to initialize the counter 50. The counter control circuitry 30 may also provide an initial counter value responsive to a LD CNT signal to establish the starting count of the counter 50.

As explained above with reference to FIG. 2 and as will be explained in greater detail below with reference to FIGS. 4–17, the counter 50 is an 8-stage quadrature counter which increments from 0 to 255 responsive to the clock signals, CLK and clock CLK 90. However, the principles described herein are equally applicable to counters having a larger or smaller number of stages and to decrementing counters, rather than incrementing counters. After the initial counter value is loaded into the counter 50, the counter 50 increments responsive to asymmetric clock signals CLK0, CLK0*, CLK1, CLK1* produced by a clock generator 60 responsive to the CLK and CLK90 signals from the clock circuit 28. The 8-bit binary count value output by the counter 50 is applied to a decoder 36 which generates command signals on a plurality of lines 39 corresponding to various counter values. An I/O interface 41 responds to the commands by transferring data into or out of one or more memory arrays 43 through one or more data latches 45.

To control timing of operations within each clock cycle in response to counts, the counter 50 must be able to increment at a frequency equal to the maximum frequency of the clock signal CKIN. Many conventional counters are inadequate for such high speed incrementing or decrementing.

Figure 4:
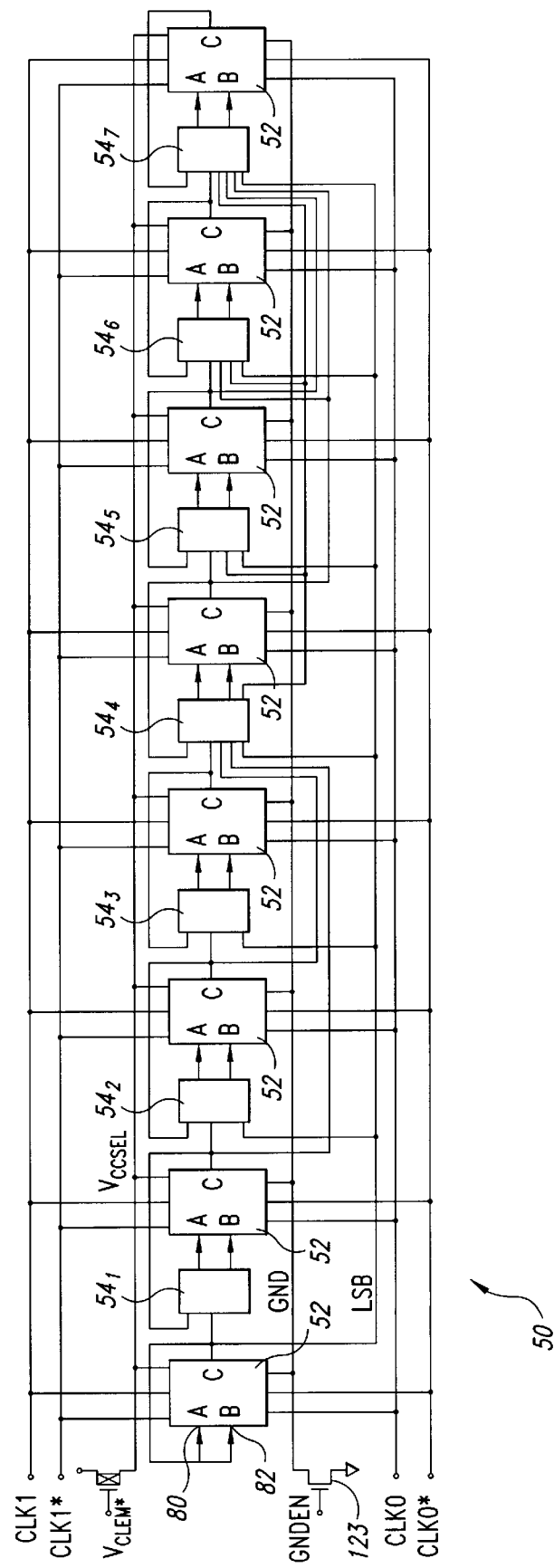
FIG. 4 is a block diagram of the counter circuit of FIG. 3 showing interconnection of eight registers and seven logic circuits.
Figure 6:
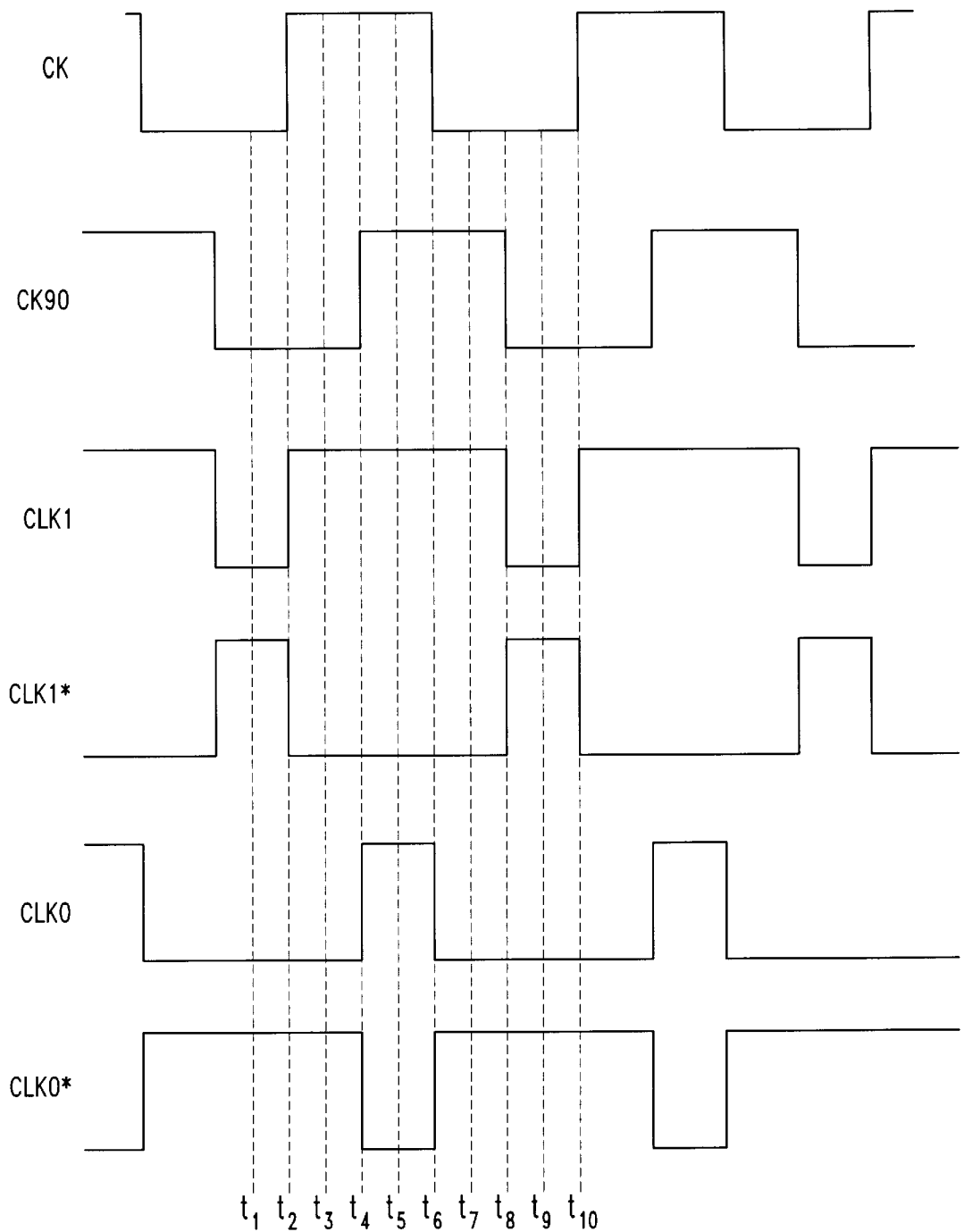
FIG. 6 is signal timing diagram of clock signals in the clock circuit of FIG. 4.

One embodiment of the incrementing counter 50 for producing such high speed counts is shown in FIG. 4. The 8-bit counter 50 is formed from eight registers 52 and seven logic circuits $54_1$–$54_7$ that operate under control of four asymmetric clock signals CLK0, CLK0*, CLK1, CLK1*. Before describing operation of the counter 50, development of the clock signals CLK0, CLK0*, CLK1, CLK1* will be described with reference to FIGS. 5 and 6.

Figure 5:
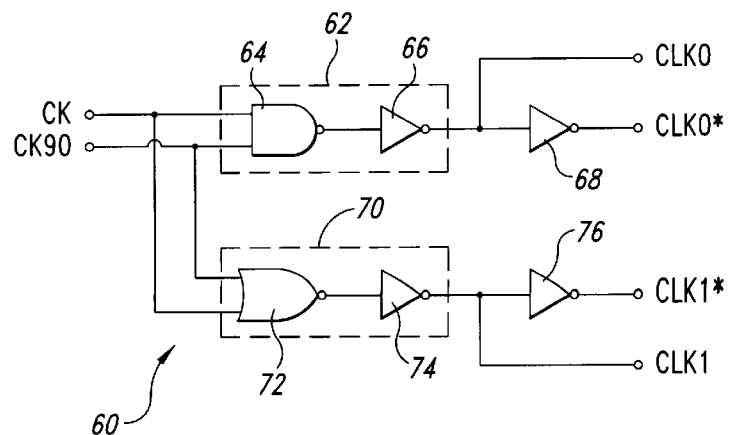
FIG. 5 is a logic diagram of a clock circuit that converts two phase-shifted clock signals into four asymmetric clock signals.

The four asymmetric clock signals CLK0, CLK0*, CLK1, CLK1* are produced in a clock generator 60 shown in FIG. 5, responsive to the two quadrature clock signals CK, CK90 from the clock circuit 28. To produce the clock signals CLK0, CLK0*, the clock signals CK, CK90 are combined at an AND circuit 62 formed from a NAND gate 64 and an inverter 66. As shown in the fifth graph of FIG. 6, the clock signal CLK0 has the same frequency as the clock signals CK, CK90 and has a 25% duty cycle. The falling edges of the clock signal CLK0 are defined by falling edges of the clock signal CK, and rising edges of the clock signal CLK0 are defined by rising edges of the clock signal CK90.

The clock signal CLK0* is formed from the clock signal CLK0 by an inverter 68. Therefore, the clock signal CLK0 has a 75% duty cycle. Additionally, the falling edges of the clock signal CLK0* are defined by rising edges of the clock signal CK90 and rising edges of the clock signal CLK0* are defined by falling edges of the clock signal CK.

The clock signal CLK1 is produced by an OR circuit 70 formed from a NOR gate 72 and an inverter 74 such that the clock signal CLK1 has a 75% duty cycle. Rising edges of the clock signal CLK1 are defined by rising edges of the clock signal CK and falling edges of the clock signal CLK1 are defined by falling edges of the clock signal CK90.

The clock signal CLK1* is formed from the clock signal CLK1 by an inverter 76 such that the clock signal CLK1* has a 25% duty cycle. Rising edges of the clock signal CLK1* are defined by falling edges of the clock signal CK90 and falling edges of the clock signal CLK1 are defined by rising edges of the clock signal CK.

Returning now to FIG. 4, the general theory of operation of the counter 50 will now be described. Each of the eight registers 52 provides one bit of an eight bit count responsive to a pair of blocking signals A, B and the four asymmetric clock signals CLK0, CLK0*, CLK1, CLK1*. The blocking signals A, B are provided to the second through eighth registers 52 through respective logic circuits $54_1$–$54_7$. The first register 52 receives its own output C at both control inputs 80, 82. In a conventional counter, each register responds to transitions of the immediately preceding register when all of the bits from preceding registers are "1." Before the selected register can transition, all of the preceding registers transition in sequence. For example, for a transition of the third least significant bit the least significant bit transitions first and causes a transition of the second least significant bit, which in turn causes a transition of the third least significant bit. One skilled in the art will recognize that the transition of the least significant bit must "ripple" through the registers to the highest value transitioning register. Since each register imposes a delay, the third least significant bit in the counter is delayed by the delay of the two preceding registers.

Unlike a conventional counter, the counter 50 feeds preceding bits forward to each of the logic circuits $54_1$–$54_7$. Each logic circuit $54_1$–$54_7$ can then determine when all of the preceding bits are "1" and enables its corresponding register 52 to transition during the next clock cycle. Because the preceding bits bypass any interceding registers 52, the logic circuit $54_1$–$54_7$ receives the preceding bits immediately. Moreover, because only the least significant bit will have changed on the immediately preceding clock cycle, all registers 50 other than the first register 50 have more than one clock cycle to establish the bit for input to the logic circuit $54_1$–$54_7$. Consequently, the conditions for transition of all of the registers 50 are established by the transition of the least significant bit in the immediately preceding clock cycle.

Figure 7:
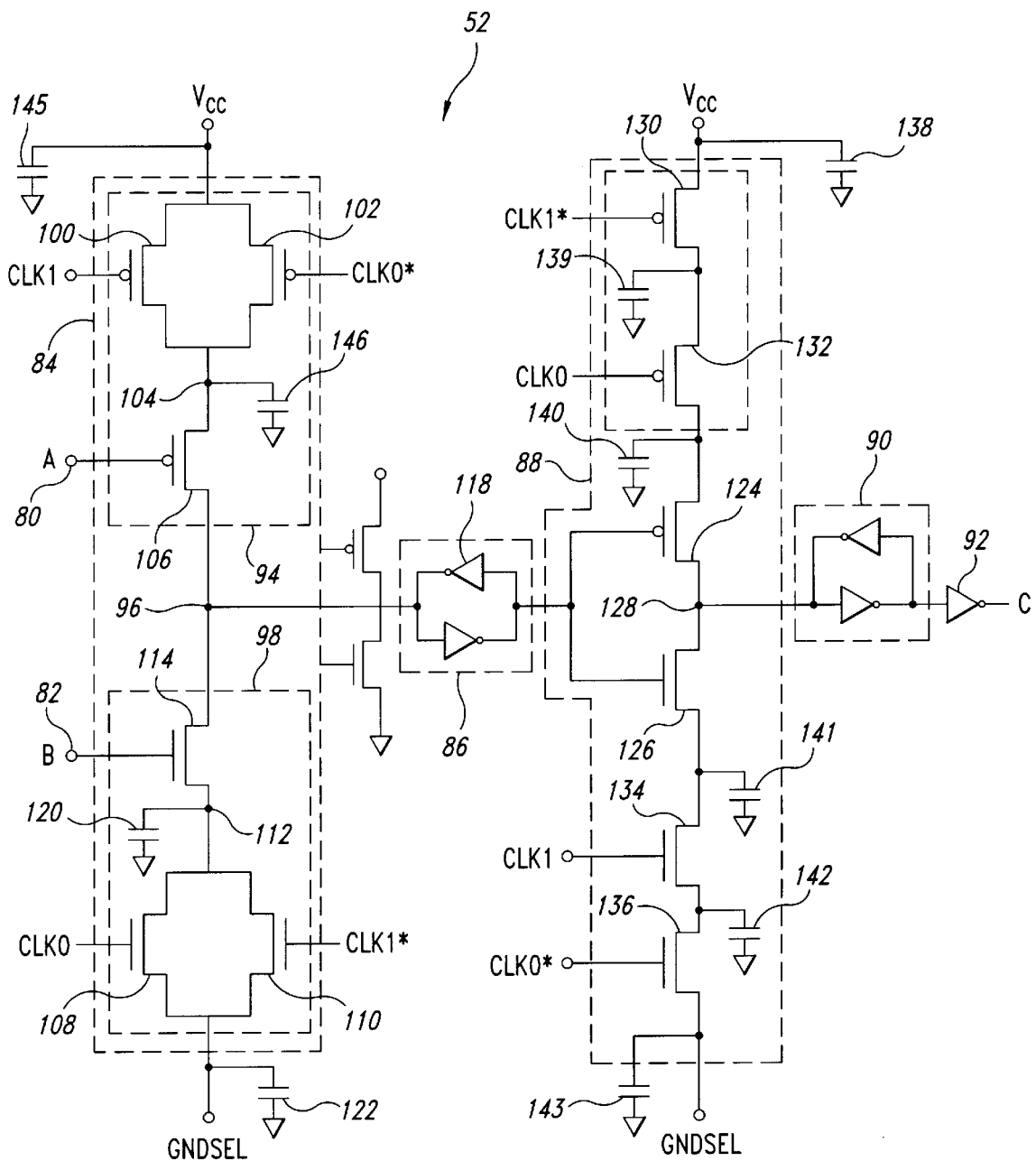
FIG. 7 is a schematic of one of the registers of the counter circuit of FIG. 4.

Before describing how the logic circuits $54_1$–$54_7$ develop the blocking signals A, B, the timing, structure, and operation of the registers 52 will first be described with reference to FIGS. 7–9. As shown in FIG. 7, each register 52 is formed from an input stage 84, an intermediate latch 86, an output stage 88, an output latch 90, and an output inverter 92. Generally, the input stage 84 is enabled to transition high or low by the blocking signals A, B and then transitions in the enabled direction in response to a selected clock edge. The transition of the input stage 84 on the selected clock edge enables transition of the output stage 88 on a subsequent clock edge.

The input stage 84 is formed from a supply leg 94 coupled between the supply voltage $V_{CC}$ and a switching node 96 and a reference leg 98 coupled between the switching node 96 and ground. The supply leg 94 receives the clock signals CLK0*, CLK1 at a pair of parallel-coupled PMOS transistors 100, 102 such that the transistors 100, 102 couple the supply voltage $V_{CC}$ to the supply node 104 when either of the clock signals CLK0*, CLK1 is low.

A PMOS blocking transistor 106 controlled by the blocking signal A couples the supply node 104 to the switching node 96. The switching node 96 thus receives the supply voltage $V_{CC}$ when the blocking signal A is low and either of the clock signals CLK0*, CLK1 is low.

The reference leg 98 receives the clock signals CLK0, CLK1* at a pair of parallel-coupled NMOS transistors 108, 110 such that the NMOS transistors 108, 110 ground the reference node 112 when either of the clock signals CLK0, CLK1* is high. An NMOS blocking transistor 114 controlled by the blocking signal B couples the reference node 112 to the switching node 96. Thus, the switching node 96 is grounded when the blocking signal B is high and either of the clock signals CLK0, CLK1* is high.

The response of the register 52 to the four possible combinations of A, B ("00," "01," "10," "11") will now be described. Considering first the case where the blocking signals A, B are "01," the logic circuits $54_1$–$54_7$ ensure that the blocking signal A will not be "0" when the blocking signal B is "1," so this case does not occur. Consequently, both of the blocking transistors 106, 114 will not be ON at the same time.

Where the blocking signals A, B are "10," both blocking transistors 106, 114 are OFF. Therefore, the clock signals CLK0, CLK0*, CLK1, CLK1* at the transistors 100, 102, 108, 110 have no effect on the voltage of the switching node 96. Consequently, no transitions occur when the blocking signals A, B are "10."

When the blocking signals A, B are "00," the lower blocking transistor 114 is OFF and the upper blocking transistor 106 is ON. Therefore, the register 52 can be modeled by the equivalent circuit of FIG. 8. Response of the equivalent circuit of FIG. 8 to the clock signals of FIG. 6 will now be described.

The following description assumes the blocking signals A, B are established during times when the switching node 96 is isolated from the supply voltage $V_{CC}$ and assumes that the switching node voltage is low initially. When one of the clock signals CLK0*, CLK1 transitions low at time $t_4$ or $t_8$, one of the transistors 100, 102 turns ON and drives the switching node voltage quickly high.

Figure 8:
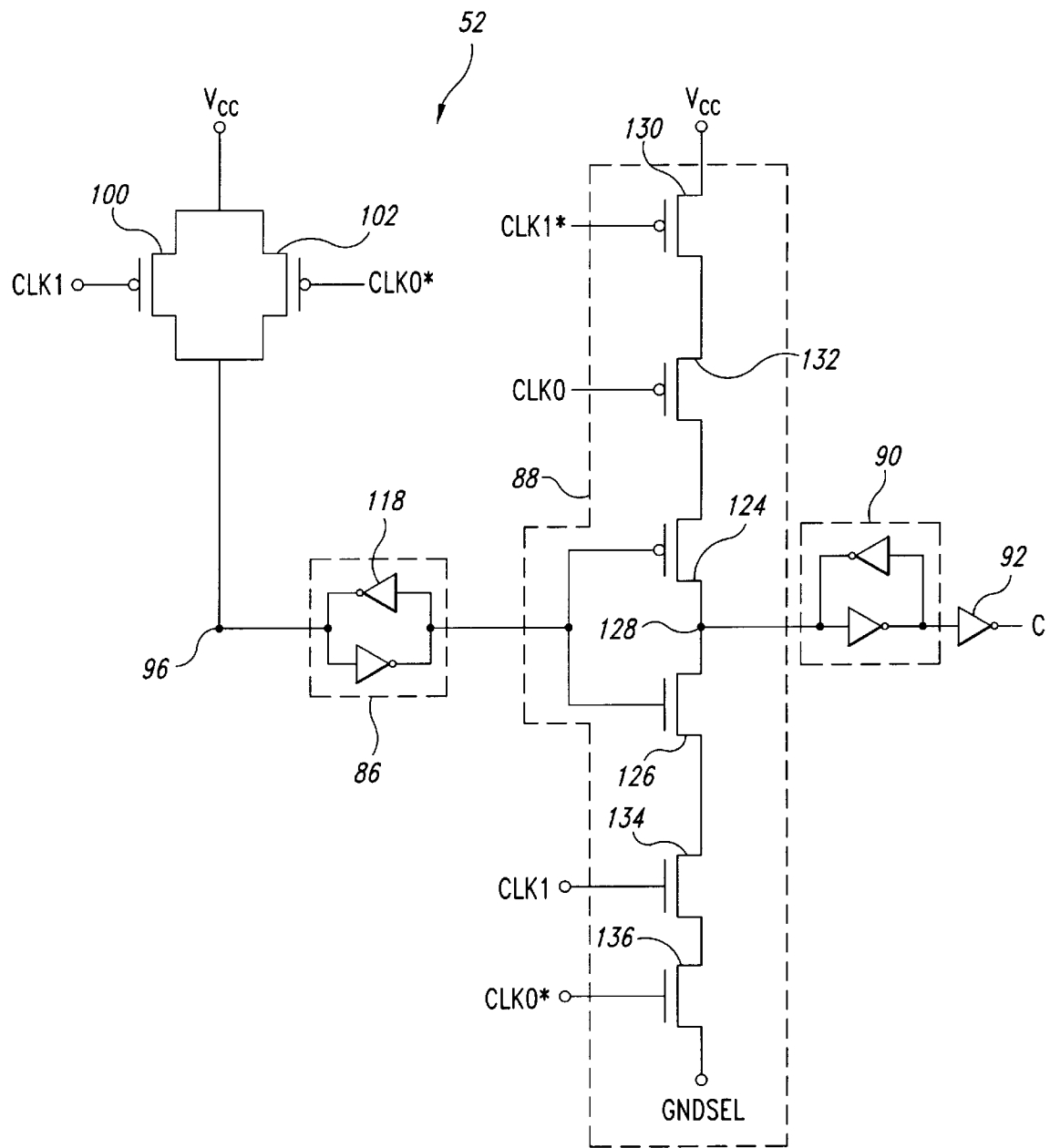
FIG. 8 is an equivalent circuit diagram of the register of FIG. 7 when both blocking signals are low.
Figure 9:
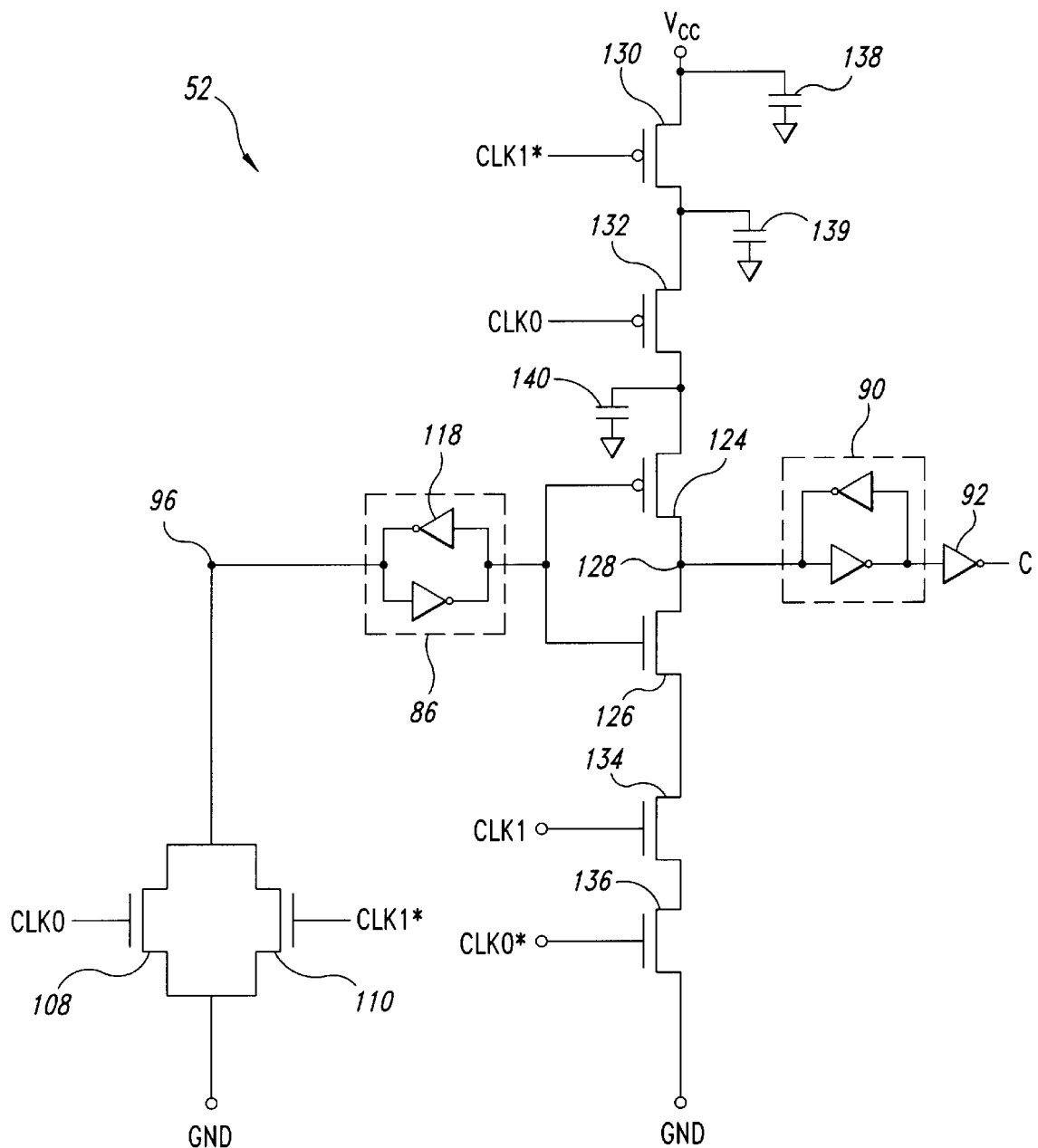
FIG. 9 is an equivalent circuit diagram of the registers of FIG. 7 when both blocking signals are high.

Comparing the equivalent circuit of FIG. 8 to the actual circuit of FIG. 7, it can be seen that the OFF blocking transistor 114 helps increase the response speed at the switching node 96, because the OFF blocking transistor 114 isolates the switching node 96 from a circuit capacitance 120 (FIG. 7) formed at the junction between the blocking transistor 114 and the NMOS transistors 108, 110. The OFF blocking transistor 114 also prevents a ground transistor capacitance 122 (FIG. 7) from delaying the response of the switching node 96. The ground transistor capacitance 122 is a result of a ground switching transistor 123 (FIG. 4) that selectively provides a ground reference to the registers 52 in response to an enable signal GNDEN. If the blocking transistor 114 were ON, (i.e., the register 52 were not accurately presented in FIG. 8) both of the capacitances 120, 122 would slow signal development at the switching node 96, because one of the transistors 108, 110 will be ON whenever one of the transistors 100, 102 is ON. By decoupling the capacitances 120, 122 from the switching node 96, the blocking transistor 114 eliminates loading of the switching node 96 by the capacitances 120, 122 and allows the node voltage to transition high very quickly.

Returning now to the operation of the equivalent circuit of FIG. 8, the high going transition at the switching node 96 causes the intermediate latch output to go low. The low output of the intermediate latch 86 drives a pair of isolation transistors 124, 126 in the output stage 88 that are serially connected at an output node 128. The isolation transistors 124, 126 are complementary transistors with commonly coupled gates so that one of the transistors 124, 126 is ON when the other is OFF. The PMOS isolation transistor 124 is coupled to the supply voltage $V_{CC}$ through a serially connected pair of PMOS multiplexing transistors 130, 132 that have their gates controlled by the clock signals CLK1*, CLK0, respectively. The NMOS isolation transistor 126 is coupled to ground through a serially connected pair of NMOS multiplexing transistors 134, 136 that have their gates controlled by the clock signals CLK1, CLK0*.

When the output of the intermediate latch 86 transitions low at time $t_4$ or $t_8$, the isolation transistor 126 turns OFF, to isolate the output node 128 from the transistors 134, 136. Also, the PMOS isolation transistor 124 turns ON to couple the output node 128 to the multiplexing transistors 130, 132.

The response of the output stage 88 will now be described separately for transitions at times $t_4$ and $t_8$. At time $t_4$, the clock signal CLK0 turns OFF the lower multiplexing transistor 132. Therefore, the output node 128 remains isolated from the supply voltage $V_{CC}$ even though the PMOS isolation transistor 124 turns ON. At time $t_6$, the clock signal CLK0 returns low, thereby turning ON the lower multiplexing transistor 132. Because all three transistors 124, 130, 132 are ON, the voltage of the output node 128 rises to the supply voltage $V_{CC}$ at time $t_6$. The high-going transition of the output node voltage propagates through the output latch 90 and output inverter 92 to produce a high-going output signal C.

Now, the case where the switching node 96 is switched high at time $t_8$ will be described. In response to the low-going output of the intermediate latch 86 at time $t_8$, the NMOS isolation transistor 126 turns OFF and the PMOS isolation transistor 124 turns ON. As described above, the OFF NMOS isolation transistor 126 isolates the output node 128 from ground. Similarly, the ON PMOS isolation transistor 124 allows the output node voltage to be controlled by the multiplexing transistors 130, 132. The upper PMOS multiplexing transistor 130 also turns OFF in response to the clock signal CLK1* going high at time $t_8$ so the output node voltage does not go high at time $t_8$.

At time $t_{10}$, the clock signal CLK1* returns low, thereby turning ON the upper PMOS multiplexing transistor 130. The three ON transistors 124, 130, 132 couple the output node 128 to the supply voltage $V_{CC}$, and the output node voltage rises quickly. Once again, the high-going transition of the output node voltage produces a high-going transition of the output signal C at time $t_{10}$. To summarize the above description, when the blocking signals A, B are both "00" the output from the register 52 goes high in response two falling edges of the asymmetric clock signals CLK0, CLK0*, CLK1, CLK1* (e.g., at times $t_8$ and $t_{10}$).

Like the blocking transistors 106, 114 of the input stage 84, the isolation transistors 124, 126 prevent capacitances 138–140 or 141–143 from loading the output node 128. For example, when the PMOS isolation transistor 124 is ON as described above, the output node 128 is isolated from the capacitances 141–143 by the OFF NMOS isolation transistor 126. Consequently, when the multiplexing transistors 130, 132 couple the output node 128 to the supply voltage, the capacitances 141–143 do not slow transition of the output node voltage.

Turning now to the case where both of the blocking signals A, B are high and the switching node voltage is initially high, the high blocking signal A turns OFF the PMOS blocking transistor 106 and the high blocking signal B turns ON the NMOS blocking transistor 114. Consequently, when the blocking signals A, B are both high, the register 52 can be represented by the equivalent circuit of FIG. 9. The OFF blocking transistor 106 isolates also the switching node 96 from capacitances 145, 146 of the supply leg 94 to prevent the capacitances 145, 146 from slowing response time of the input stage 84.

The gates of the transistors 108, 110 are controlled by the clock signals CLK0, CLK1*, respectively. When either of the clock signals CLK0, CLK1* is high, one of the transistors 108, 110 will couple the switching node 96 to ground. Consequently, the switching node 96 will transition from high to low when either of the clock signals CLK0, CLK1* transitions high, as occurs at times $t_4$ and $t_8$. At time $t_4$, the low-going transition at the switching node 96 causes the intermediate latch output to transition high, thereby turning OFF the PMOS isolation transistor 124 and turning ON the NMOS isolation transistor 126. At time $t_4$, the clock signal CLK0* also turned OFF the lower multiplexing transistor 136 to isolate the output node 128 from ground. Thus, the voltage of the output node 128 does not change in response to the isolation transistor 126 turning ON.

At time $t_6$, the clock signal CLK0* returns high, thereby turning ON the NMOS multiplexing transistor 136. The ON transistors 126, 134, 136 quickly pull the output node low. The output node 128 can be switched quickly by the three ON transistors 126, 134, 136, because the PMOS isolation transistor 124 isolates the output node 128 from the capacitances 138–140. In response to the low-going transition of the output node 128, the output signal C also goes low, at time $t_6$.

Considering now the situation where the latch output transitions high at time $t_8$, the transistor 124 turns OFF, thereby isolating the output node 128 from the capacitances 138–140. The high-going output from the intermediate latch 86 also turns ON the NMOS isolation transistor 126 so that the multiplexing transistors 134, 136 can control the output node voltage.

At time $t_8$, the clock signal CLK1 also transitions low, thereby turning OFF the multiplexing transistor 134. Consequently, the output node voltage remains unaffected when the isolation transistor 126 turns ON at time $t_8$.

At time $t_{10}$, the clock signal CLK1 returns high, thereby turning ON the multiplexing transistor 134. The lower multiplexing transistor 136 is already ON. Therefore, the three ON transistors 126, 134, 136 couple the output node 128 to ground. The output node voltage drops quickly and pulls the output voltage C low slightly after time $t_{10}$ due to the delays of the output latch 90 and inverter 92. To summarize, when the blocking signals A, B are "11," the output of the register 50 transitions low in response to two falling edges of the clock signals CLK0, CLK0*, CLK1, CLK1*.

Provision of the blocking signals A, B by the logic circuits $54_1$–$54_7$ will now be described. As noted above, the logic circuits $54_1$–$54_7$ provide the blocking signals A, B to seven of the registers while the blocking signals A, B for the first register 52 are provided by its output signal C, as shown in FIG. 4. Establishment of the blocking signals A, B by the logic circuits $54_1$–$54_7$ and by the direct feedback of the first register output to the first register input will now be described. Operation of the first register 52 will be considered first.

As discussed previously, when the blocking voltages A, B are both low, the register 52 can be modeled as shown in FIG. 8. Similarly, when both blocking signals A, B are high, the register 52 can be modeled as shown in FIG. 9. As detailed in the above description, regardless of which model is appropriate, the output C will transition either high or low slightly after times $t_6$ or $t_{10}$ in response to a sequence of clock transitions at times $t_4$ and $t_6$ or $t_8$ and $t_{10}$, respectively. One skilled in the art will recognize that each time the output C transitions, the equivalent circuit of the first register 52 will change from that of FIG. 8 to that of FIG. 9 or vice versa, because the blocking signals A, B equal the output C of the first register 52. Therefore, the output of the first register 52 will toggle low and high during each period of the clock signal CK.

Control of the second register 52 by the first logic circuit $54_1$ will now be described. The output C of the first register 52 is input to the first logic circuit $54_1$ along with the fed back output C of the second register 52. The first logic circuit $54_1$ establishes the blocking signals A, B such that the output of the second register 52 changes once for every two changes of the output of the first register 52, as will now be described.

Figures 10A, 10B:
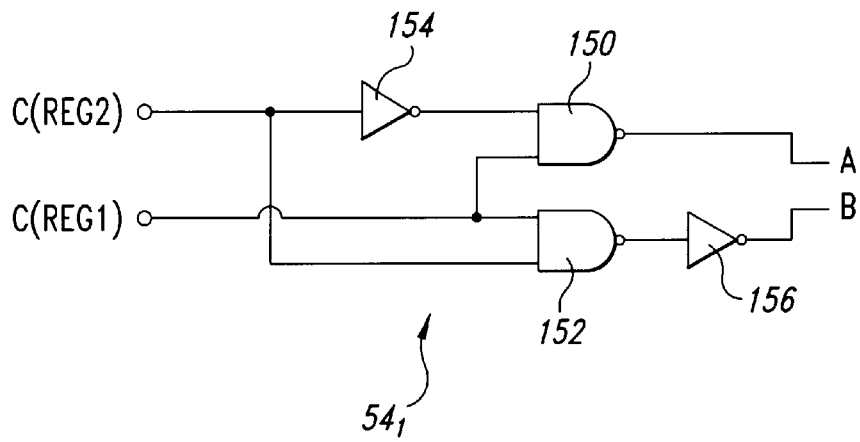
FIG. 10A is a schematic of a first logic circuit for producing blocking signals for the second register of the counter circuit of FIG. 4.
FIG. 10B is a truth table showing inputs to and outputs from the logic circuit of FIG. 10A.
Figure 13:
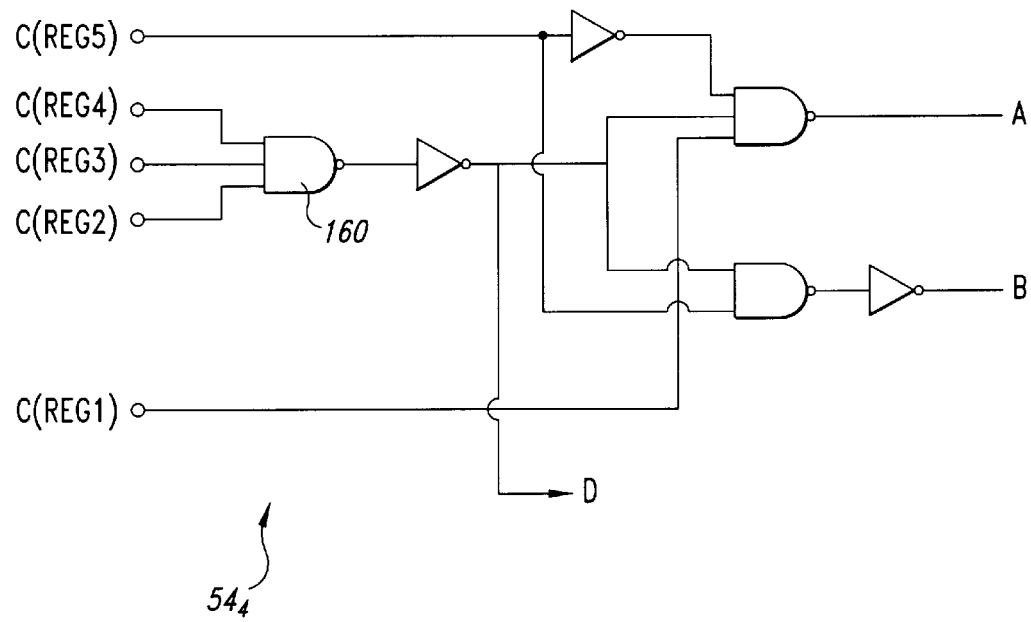
FIG. 13 is a schematic of a fourth logic circuit for producing blocking signals for the fifth register of the counter circuit of FIG. 4.
Figure 14:
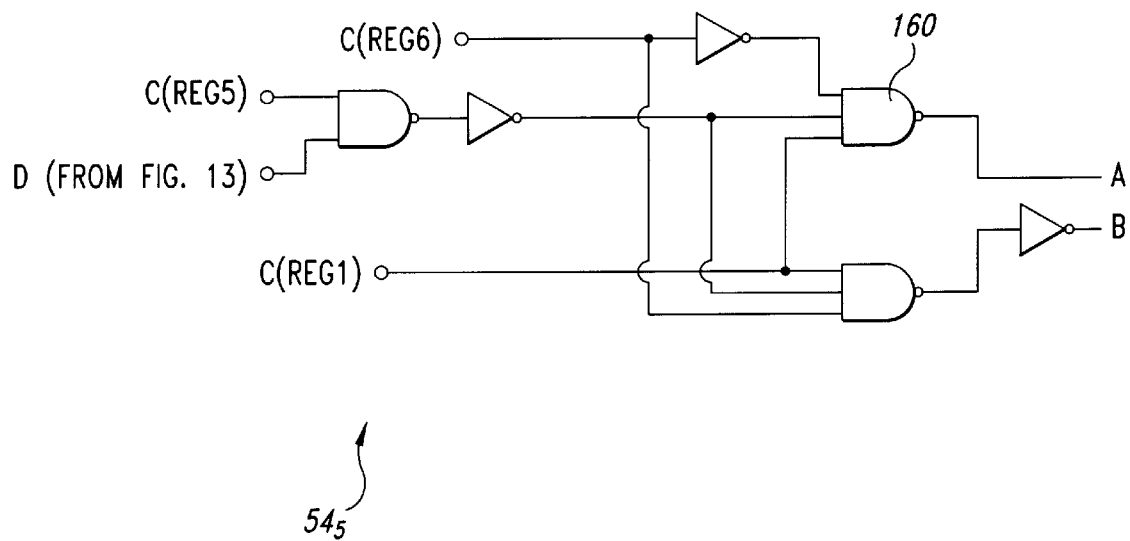
FIG. 14 is a schematic of a fifth logic circuit for producing blocking signals for the sixth register of the counter circuit of FIG. 4.
Figure 15:
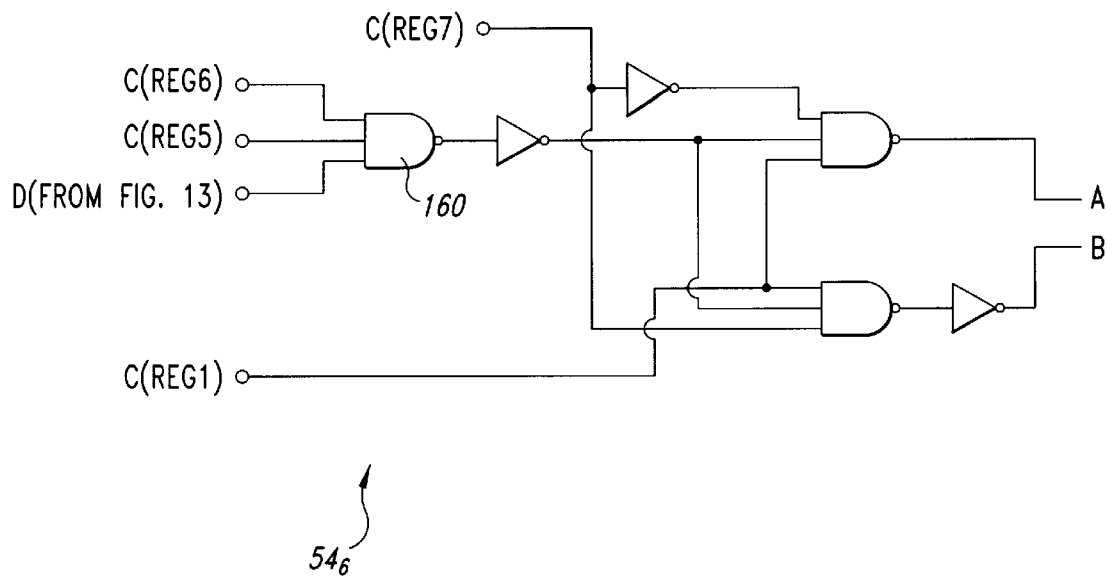
FIG. 15 is a schematic of a sixth logic circuit for producing blocking signals for the seventh register of the counter circuit of FIG. 4.
Figure 16:
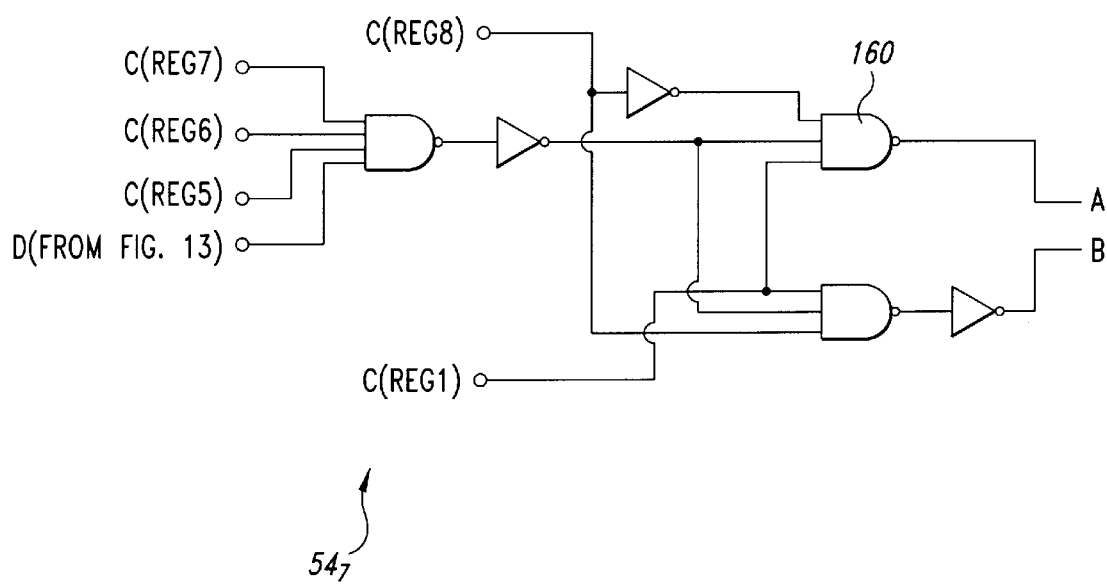
FIG. 16 is a schematic of a seventh logic circuit for producing blocking signals for the eighth register of the counter circuit of FIG. 4.

As shown in FIG. 10A, the logic circuit $54_1$ is formed from a pair of NAND gates 150, 152 and a pair of inverters 154, 156. The NAND gates 150, 152 each receive the feedback output C from the first register 52 at respective first inputs. The first NAND gate 150 receives an inverted version of the output C from the second register 52 at its second input and the second NAND gate 152 receives the output C from the 2nd register at its second input. The output blocking signals A, B are produced according to the truth table shown in FIG. 10B. Thus, when the output of the first register is a "0," the first logic circuit 54 outputs "10." As described above, when the signals A, B are "10," the second register 52 will not toggle in response to the clock signals CLK0, CLK0*, CLK1, CLK1*. Thus, for the first and third condition of the truth table of FIG. 10B, the output of the second register will remain constant.

When the output C from the first and second registers 52 are "01," the second register 52 will be equivalent to the circuit of FIG. 8, and the output of the second register 52 will transition high in response to the clock signals CLK0, CLK0*, CLK1, CLK1*. Similarly, when the outputs C of the first and second registers 52 are "11," the second register 52 will be equivalent to the circuit of FIG. 9, and the output C from the second register 52 will transition low in response to the clock signals CLK0, CLK0*, CLK1, CLK1*. As a result, the output C from the second register 52 toggles as the second least significant bit of a conventional binary count.

Response of the third register 52 will now be described with reference to FIGS. 11A and 11B. The second logic circuit $54_2$ is formed from a pair of inverters 158 and a pair of three input NAND gates 160. The first input of each of the NAND gates 160 receives the output C from the first register 52. The second input of each of the NAND gates 160 receives the output C from the second register 52. The third input of the first NAND gate 160 receives an inverted version of the output C from the third register 52, and the third input of the second NAND gate receives the output C from the third register 52. The output of the first NAND gate 160 forms the blocking signal A and the output of the second NAND gate 160 is inverted to produce the blocking signal B.

One skilled in the art will recognize that if the output C from either the first or second register is a "0," both of the NAND gates will output a "1" and the blocking signals A, B will be "10," as shown in the truth table of FIG. 11B. Thus, whenever either of the first or second registers 52 outputs a "0," transition of the third register 52 will be disabled.

If both of the first and second registers 52 output "1," and the output C from the third register is a "0," the second logic circuit 54₂ sets both of the blocking signals A, B to "00." As described above with reference to FIG. 9, when the blocking signals A, B are "00," the output C from the third register 52 will go high responsive to the clock signals CLK0, CLK0*, CLK1, CLK1*.

Similarly, when the first three registers 52 output "1" the second logic circuit 54₂ sets the blocking signals A, B to "11." As described above when the blocking signals A, B are "11," the output of the third register 52 will transition low responsive to the clocking signals CLK0, CLK0*, CLK1, CLK1*. Thus, the output C of the third register 52 represents the third least significant bit of the binary count.

As described above, the counter 50 differs from a conventional counter circuit because on the immediately preceding clock cycle the conditions for the third register 52 to transition are not established by a transition of the second register 52. Instead, the conditions on the immediately preceding clock cycle are established only by transitions of the output C from the first register 52. Consequently, the "ripple" delay is eliminated.

Because other inputs to the logic circuits 54₁–54₇ are not established on the clock cycle immediately preceding a transition of the corresponding register 52, each of other inputs to the logic circuits 54₁–54₇ has more than one clock cycle to become established prior to the transition. Because the first register 52 is the only register that must transition in the immediately preceding clock cycle, the set up time for subsequent transitions is defined by the fastest register, thereby allowing the counter 50 to operate at a higher speed.

The first register 52 transitions more quickly than any of the other registers 52. This difference in transition times is due to the first register 52 using direct feedback of the output C as its blocking signals A, B, as opposed to the generation of blocking signals A, B by the logic circuits 54₁–54₇ for the other registers 52. Because control of the first register 52 has none of the gate delays of the logic circuits 54₁–54₇, transitioning of the first register 52 can be accomplished more quickly than the other registers 52.

One skilled in the art will recognize that other logic circuit structures may also employ this principle. For example, where the counter 50 is a decrementing counter, NOR gates would typically be used instead of NAND gates. One skilled in the art will recognize that feeding forward the least significant bit will be equally applicable to such NOR gate based structures.

One skilled in the art will recognize from the schematics of FIGS. 12–16 that the logic circuits 54₃–54₇ similarly enable transitions of their corresponding registers only when the output C from all of the preceding registers are "1." Additionally, one skilled in the art will recognize that the blocking signals A, B for transitions of the registers 54₃–54₇ will thus be controlled by transitions of the output C from the first register 52.

As will now be explained with reference to the three input NAND gate 160 shown in FIG. 17, the response of the counter 50 is further accelerated by coupling of the output C from the first register 52 to specific inputs of the NAND gates 150, 160 in the respective logic circuits 54ₙ. This acceleration utilizes the fact that the response of the NAND gates 150, 160 to signals at the different NAND gate inputs is not uniform.

Figure 17:
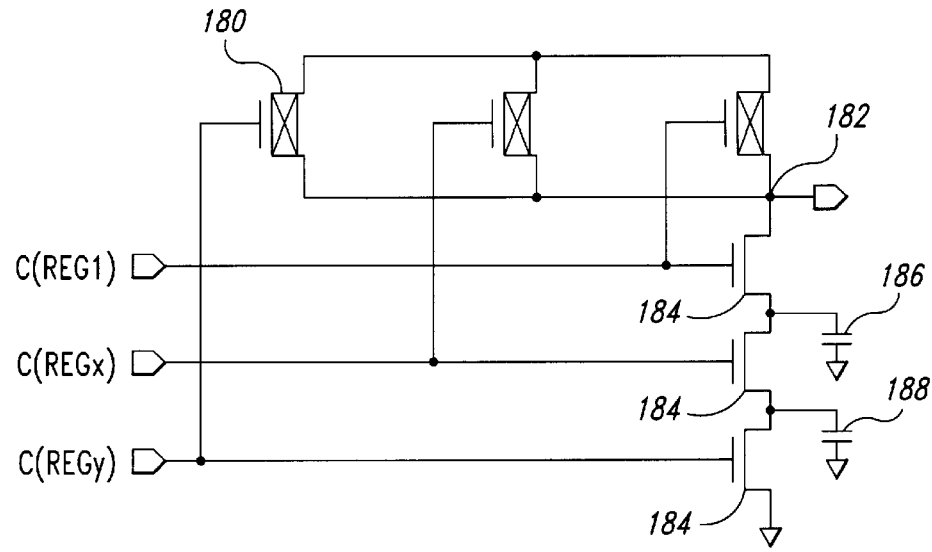
FIG. 17 is a schematic of a three input NAND gate including circuit capacitances.

The three input NAND gate 160 of FIG. 17 is formed from three PMOS transistors 180 coupled in parallel between the supply voltage a node 182 and three NMOS transistors 184. Each of PMOS transistors 180 and each of the NMOS transistors 184 is controlled by the output C from one of the preceding registers 52. The uppermost NMOS transistor 184 is controlled by the output C from the first register 52. As will now be explained, the gate of the uppermost NMOS transistor forms the "fast" input to the NAND gate 160.

When the output C from the first register 52 transitions from high to low, the upper NMOS transistor 184 turns OFF and the rightmost PMOS transistor 180 turns ON. Assuming that the other inputs to the NAND gate 160 are high, the remaining two PMOS transistors 180 provide no current path to the supply voltage $V_{CC}$. Therefore, the rightmost PMOS transistor 180 will pull the output node 182 high. The uppermost NMOS transistor 184 isolates the output node 182 from the reference potential and from parasitic capacitances 186, 188 at junctions between the NMOS transistors 184. Consequently, the output node 182 switches high quickly.

When a low-going input other than the input from the first register 52 is applied to the NAND gate 160, the leftmost or center PMOS transistor 180 will turn ON and the center or lowermost NMOS transistor 184 will turn OFF. The ON leftmost or center PMOS transistor 180 will pull the output node 182 high. However, the rise of the output voltage will be slowed by charge storage of the parasitic capacitances 186, 188.

The parasitic capacitances 186, 188 do not affect the response of the NAND gate 160 to transitions of the "fast" NAND gate input, because the upper NMOS transistor 184 blocks stored charge from the parasitic capacitance from sustaining the output voltage. As noted above, the output C of the first register 52 provides the last input transition to the logic circuit 54ₙ to establish conditions for an output transition. By coupling the output of the first register 52 to the "fast" input the time to establish the conditions for an output transition is minimized. One skilled in the art will understand that the following description of "fast" inputs is equally applicable to two or four input NAND gates having fewer or more than three inputs and to all kinds of NOR gates.

Figure 18:
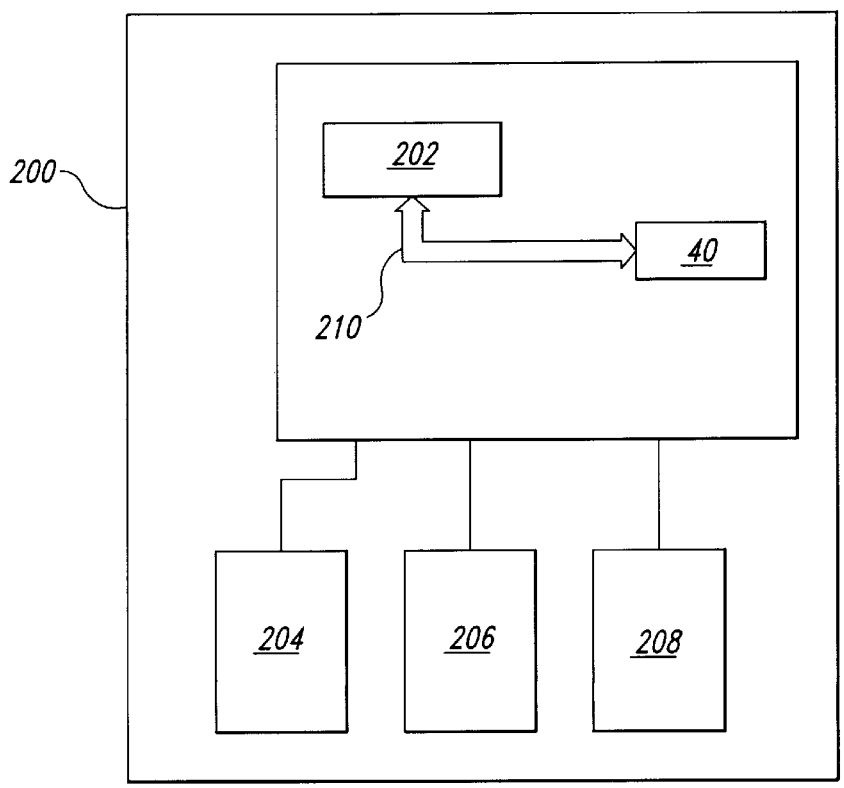
FIG. 18 is a block diagram of a computer system incorporating the memory device of FIG. 3.

FIG. 18 is a block diagram of a computer system 200 that contains the memory device 40 of FIG. 3. The computer system 200 includes a processor 202 for performing computer functions such as executing software to perform desired calculations and tasks. The processor 202 also includes command and data buses 210 to activate the memory device 40. One or more input devices 204, such as a keypad or a mouse, are coupled to the processor 202 and allow an operator to manually input data thereto. One or more output devices 206 are coupled to the processor 202 to display or otherwise output data generated by the processor 202. Examples of output devices include a printer and a video display unit. One or more data storage devices 208 are coupled to the processor to store data on or retrieve data from external storage media (not shown). Examples of storage devices 208 and storage media include drives that accept hard and floppy disks, tape cassettes and compact-disk read-only memories.

From the foregoing it will be appreciated that, although specific embodiments of the invention have been described herein for purposes of illustration, various modifications may be made without deviating from the spirit and scope of the invention. For example, one skilled in the art will recognize that, although the counter 50 has been described herein as an incrementing counter, the principles described herein are equally applicable to decrementing counters. Accordingly, the invention is not limited except as by the appended claims.

I claim:

1. A counter circuit assembly responsive to produce a plurality of bits having logic states representing a count in response to a clock signal, comprising:

a first register corresponding to a first bit of the count, the first register having a clock input for receiving the clock signal and a first bit output terminal that provides the first bit, the first register being responsive to the clock signal to toggle the first bit between first and second states;

a plurality of other registers in a sequence, each corresponding to a respective bit of the count, each other register having a bit output terminal that provides the corresponding bit and a control input terminal, each other register being responsive to a respective control signal at the control input terminal to toggle the respective bit between first and second states; and a plurality of logic circuits, each corresponding to a respective one of the other registers, each logic circuit having a first logic input terminal coupled to the bit output terminal of at least one register other than the register bit output terminal of the immediately preceding register in the sequence of other registers, each logic circuit further including an output terminal coupled to the respective control input terminal of its corresponding register, each logic circuit being responsive to toggling of the bit from the at least one register other than the immediately preceding register to produce the respective control signal.

2. The counter circuit assembly of claim 1 wherein the bit output terminal of the at least one register other than the imnmediately preceding register in the sequence of other registers is the first bit output terminal.

3. The counter circuit assembly of claim 1, further comprising a clock generator having a clock input terminal and first, second, third and fourth clock output terminals, the clock generator being operative to produce first, second, third and fourth clock signals at the first, second, third and fourth clock output terminals, respectively, in response to the input clock signal, wherein toggling of each of the registers is responsive to the first, second, third and fourth clock signals.

4. The counter circuit assembly of claim 1 wherein each of the logic circuits includes a second logic input terminal coupled to the first bit output terminal and wherein each logic circuit is responsive to toggling of the first bit to produce the respective control signal.

5. The counter circuit assembly of claim 4 wherein each of the logic circuits includes a second logic input terminal coupled to the bit output terminal of the respective register.

6. The counter circuit assembly of claim 1 wherein each of the logic circuits has a first response time to a signal at the first logic input and a second response time to a signal at the second logic, wherein the first response time is shorter than the second response time.

7. The counter circuit of claim 6 wherein the clock generator is configured to produce the first, second, third and fourth clock signals with transitions from a first clock state to a second clock state at respective quarter-period intervals of the input clock signal.

8. The counter circuit assembly of claim 7 wherein each of the registers includes:

a first switching circuit having a supply voltage terminal for receiving a supply voltage, a first control terminal for receiving the control signal, first and second clock signal inputs coupled to the first and second clock output terminals, and a first switching voltage output terminal, the first switching circuit being responsive to the transitions of the first and second clock signals and to the control signal to couple the supply voltage terminal to the first switching output terminal;

a first isolation circuit coupled between the first switching output terminal and the bit output terminal, the first isolation circuit having a first control input and being responsive to a first control signal to isolate the first switching output terminal from the bit output terminal;

a second switching circuit having a reference voltage terminal for coupling to a reference potential, a second control terminal for receiving the control signal, third and fourth clock signal inputs coupled to the third and fourth clock output terminals, and a second switching voltage output terminal, the second switching circuit being responsive to the transitions of the third and fourth clock signals to couple the reference voltage terminal to the second switching output terminal; and a second isolation circuit coupled between the second switching output terminal and the bit output terminal, the second isolation circuit having a second control input and being responsive to a second control signal to isolate the second switching output terminal from the bit output terminal.

9. A counter circuit responsive to a clock signal to produce a plurality of bits having logic states representing a count, comprising:

a first register corresponding to a first bit of the count, the first register having a clock input for receiving the clock signal and a first bit output terminal that provides the first bit, the first register being responsive to toggle the first bit between first and second states in response to the clock signal;

a plurality of other registers in a sequence, each corresponding to a respective bit of the count, each other register having a bit output terminal that provides the corresponding bit and a control input terminal, each other register being responsive to a respective control signal at the control input terminal to toggle the respective bit between first and second states; and a plurality of logic circuits, each corresponding to a respective one of the other registers, each logic circuit having, for each of the preceding registers in the sequence, a least one logic input terminal coupled to the bit output terminal of the respective preceding register in the sequence, each logic circuit further including a first bit input terminal coupled to the first bit output terminal and an output terminal coupled to the respective control input terminal of its corresponding register, each logic circuit including an enabling logic gate having one or more logic inputs coupled to the at least one logic input terminals and a second input coupled to the first bit input terminal, the enabling logic gate being responsive to a predetermined pattern of bits at the one or more logic inputs to produce the control signal in response to toggling of the first bit.

10. The counter circuit of claim 10 wherein each of the logic circuits has a first response time to a signal at the second input and respective response times to signals at one or more logic inputs, wherein the first response time is shorter than the second response time.

11. The counter circuit of claim 9 wherein the predetermined pattern of bits includes all of the bits having the same state.

12. The counter circuit of claim 11 wherein the predetermined pattern of bits includes all of the bits being "1."

13. The counter circuit of claim 9 further comprising a clock generator having a clock input terminal and first, second, third and fourth clock output terminals, the clock generator being operative to produce first, second, third and fourth clock signals at the first, second, third and fourth clock output terminals, respectively, in response to the input clock signal, wherein toggling of each of the registers is responsive to the first, second, third and fourth clock signals.

14. The counter circuit of claim 13 wherein the clock generator is configured to produce the first, second, third and fourth clock signals with transitions from a first clock state to a second clock state at respective quarter-period intervals of the input clock signal.

15. A register circuit, comprising:
a first control terminal;
a second control terminal;
an output node;
a supply terminal adapted to receive a supply voltage;
a supply node;
a reference terminal adapted for coupling to a reference voltage;
a reference node;
a first switching circuit having a first switching circuit capacitance, the first switching circuit including a voltage input coupled to the supply terminal, a first switching input, and a voltage output coupled to the supply node, the first switching circuit being responsive to a first clock signal at the first switching input to selectively couple the supply terminal to the supply node;
a second switching circuit having a second switching circuit capacitance, the second switching circuit including a voltage input coupled to the reference terminal, a second switching input, and a voltage output coupled to the supply node, the second switching circuit being responsive to a second clock signal at the second switching input to selectively couple the reference terminal to the reference node;
a first blocking switch coupled between the supply node and the output node, the first blocking switch having a first switching input coupled to the first input control terminal, the first blocking switch being responsive to a first blocking signal to couple the supply node to the output node and responsive to a second blocking signal to isolate the supply node from the output node; and
a second blocking switch coupled between the reference node and the output node, the second blocking switch having a second switching input coupled to the second control terminal, the second blocking switch being responsive to the first switching signal to isolate the reference node from the output node and responsive to the second switching signal to isolate the output node from the reference node.

16. The register circuit of claim 15, further comprising an intermediate latch having a latch input coupled to the output node and a latch output, the intermediate latch being responsive to provide a first intermediate voltage in response to the output node being coupled to the supply voltage and a second intermediate voltage in response to the output node being coupled to the reference voltage.

17. The register circuit of claim 16, further comprising a clock generator circuit having a clock input terminal and first and second clock output terminals, the first clock output terminal being coupled to the first switching input and the second clock output terminal being coupled to the second switching input, the clock generator being responsive to an input clock signal at the clock input terminal to produce the first and second asymmetric clock signals at the first and second clock output terminals, respectively, the first asymmetric clock signal having a different duty cycle than the second asymmetric clock signal.

18. The register circuit of claim 17 wherein the clock generator includes a third clock output terminal, the clock generator further being responsive to the input clock signal at the clock input terminal to produce a third asymmetric clock signal at the third clock output terminal, the register circuit further comprising:
a register output node; and
a third switching circuit coupled between the supply terminal and the register output node, the third switching circuit having a third switching input coupled to the third clock output terminal and being responsive to the third clock signal to selectively couple the register output node to the supply terminal.

19. The register circuit of claim 18 wherein the clock generator includes a fourth output terminal, and wherein the clock generator is responsive to the input clock signal at the clock input terminal to produce a fourth asymmetric clock signal at the fourth clock out put terminal, the register circuit further comprising a fourth switching circuit coupled between the reference terminal and the register output node, the fourth switching being responsive to the fourth asymetric clock signal to selectively couple the register output node to the reference terminal.

20. The register circuit of claim 19, further comprising a first isolation circuit coupled between the supply terminal and the register output node, the first isolation circuit including a first disable input and being responsive to the first intermediate signal at the first disable input to isolate the third switching circuit from the register output node.

21. The register circuit of claim 20 wherein the clock generator includes a fourth output terminal, and wherein the clock generator is responsive to the input clock signal at the clock input terminal to produce a fourth asymmetric clock signal at the fourth clock output terminal, the register circuit further comprising a fourth switching circuit coupled between the reference terminal and the register output node, the fourth switching being responsive to the fourth asymetric clock signal to selectively couple the register output node to the reference terminal.

22. The register circuit of claim 21, further comprising a second isolation circuit coupled between the fourth switching circuit and the reference output node, the second isolation circuit including a second disable input and being responsive to the second intermediate signal at the second disable input to isolate the fourth switching circuit from the register output node.

23. The register circuit of claim 22 wherein the isolation circuits are transistors.

24. The register circuit of claim 23 wherein the transistors are complementary transistors.

25. A counter circuit, comprising:
a clock generator having a master clock input terminal and first, second, third and fourth clock output terminals, the clock generator being operative to produce first, second, third and fourth clock signals at the first, second, third and fourth clock output terminals, respectively, in response to the master clock signal, the first, second, third and fourth clock signals having transitions from a first state to a second state at respective quarter-period intervals of the master clock signal;

a counter output terminal;

a first switching circuit having a supply voltage terminal for receiving a supply voltage, first and second clock signal inputs coupled to the first and second clock output terminals, and a first switching voltage output terminal, the first switching circuit being responsive to the transitions of the first and second clock signals to couple the supply voltage terminal to the first switching output terminal;

a first isolation circuit coupled between the first switching output terminal and the counter output terminal, the first isolation circuit having a first control input and being responsive to a first control signal to isolate the first switching output terminal from the counter output terminal;

a second switching circuit having a reference voltage terminal for coupling to a reference potential, third and fourth clock signal inputs coupled to the third and fourth clock output terminals, and a second switching voltage output terminal, the second switching circuit being responsive to the transitions of the third and fourth clock signals to couple the reference voltage terminal to the second switching output terminal; and a second isolation circuit coupled between the second switching output terminal and the counter output terminal, the second isolation circuit having a second control input and being responsive to a second control signal to isolate the second switching output terminal from the counter output terminal.

26. The counter circuit of claim 25 wherein the first and second isolation circuits comprise complementary transistors.

27. The counter circuit of claim 25, further including an intermediate latch circuit having a latch input terminal and a latch output terminal coupled to the first and second control terminals, the latch circuit being responsive to a switching voltage at the latch input terminal to provide the first and second control signals at the latch output terminal.

28. The counter circuit of claim 27, further including an input stage including:

a supply node;

a reference node;

a third switching circuit having a third switching circuit capacitance, the third switching circuit including a voltage input coupled to the supply voltage terminal, a 1st switching input, and a voltage output coupled to the supply node, the third switching circuit being responsive to the first clock signal at the third switching input to selectively couple the supply terminal to the supply node;

a fourth switching circuit having a fourth switching circuit capacitance, the fourth switching circuit including a voltage input coupled to the reference voltage terminal, a second switching input, and a voltage output coupled to the reference node, the fourth switching circuit being responsive to the second clock signal at the second switching input to selectively couple the reference terminal to the reference node;

a first blocking switch coupled between the supply node and the latch input terminal, the first blocking switch having a first switching input, the first blocking switch being responsive to a first blocking signal to couple the supply node to the latch input terminal and responsive to a second blocking signal to isolate the supply node from the latch input terminal; and a second blocking switch coupled between the reference node and the latch input terminal, the second blocking switch having a second switching input, the second blocking switch being responsive to the first blocking signal to isolate the reference node from the latch input terminal and responsive to the second switching signal to couple the reference node to the latch input terminal.

29. The counter circuit of claim 25 wherein the first switching circuit includes a first pair of serially coupled MOS transistors.

30. The counter circuit of claim 29 wherein the second switching circuit includes a second pair of serially coupled MOS transistors.

31. The counter circuit of claim 30 wherein the transistors in the first pair are PMOS transistors and the transistors in the second pair are NMOS transistors.

32. An output stage of a counter circuit responsive to first and second clock signals, each of the clock signals having respective first and second states, and a first switching signal to produce a counter output signal, comprising:

a counter output terminal;

a supply terminal for coupling to a supply voltage;

a supply node;

a reference terminal for coupling to a reference voltage;

a reference node;

a first clock terminal for receiving the first clock signal;

a second clock terminal for receiving the second clock signal;

first and second switches serially coupled between the supply terminal and the supply node, each of the first and second switches including a respective switching terminal, the first switching terminal being coupled to the first clock terminal, the first switch being responsive to close in response to a first combination of states of the first clock signal and the second clock signal and the second switch being responsive to close in response to the first combination;

third and fourth switches serially coupled between the reference terminal and the reference node, each of the third and fourth switches including a respective switching terminal, the third switching terminal being coupled to the first clock terminal, the third switch being responsive to close in response to a second combination of states of the first clock signal and the second clock signal and the fourth switch being responsive to close in response to the second combination;

a first isolation switch coupled between the supply node and the counter output terminal, the first isolation switch including a first control input for receiving the first switching signal, the first isolation switch being responsive to the first switching signal to open; and a second isolation switch coupled between the reference node and the counter output terminal, the second isolation switch including a second control input for receiving the first switching signal, the second isolation switch being responsive to the first switching signal to close.

33. The output stage of claim 32 wherein the first and second states are opposite logic states.

34. The output stage of claim 32 wherein the first and second isolation circuits comprise complementary transistors.

35. A counter circuit assembly responsive to produce a plurality of clock bits having logic states representing a number of pulses of a clock signal, comprising:

a least significant bit register having an LSB output terminal, an LSB control input terminal and an LSB clock input terminal for receiving the clock signal, the least significant bit register producing a least significant bit at the LSB output terminal in response to the clock signal at the clock input terminal;

a plurality of more significant bit counter circuits, each more significant bit counter circuit including:
 a bit output terminal;
 a first counter input terminal coupled to a bit output terminal of a preceding counter circuit;
 an LSB input terminal;
 a combining logic circuit having a first logic input coupled to the bit output terminal, a second logic input coupled to the LSB input terminal, a third logic input coupled to the first counter input terminal, and a logic output terminal, the combining logic circuit being configured to provide a logic output signal in response to logic signals at the first, second and third logic inputs; and
 a bit register having a more significant bit output coupled to the bit output terminal and a first control input coupled to the logic output terminal, the bit register providing a more significant bit to the bit output terminal in response to the logic output signal; and a bypass circuit coupled between the LSB output terminal and the LSB input terminals.

36. The counter circuit assembly of claim 36 wherein the LSB control input terminal is connected directly to the LSB output terminal.

37. The counter circuit assembly of claim 35 wherein each of the logic circuits has a first response time to a signal at the first logic input, a second response time to a signal at the second logic input, and has a third response time to a signal at the third logic input, wherein the first response time is shorter than the second response time or the third response time.

38. The counter circuit assembly of claim 35 responsive to an input clock signal, further comprising a clock generator having a clock input terminal and first, second, third and fourth clock output terminals, the clock generator being operative to produce first, second, third and fourth clock signals at the first, second, third and fourth clock output terminals, respectively, in response to the input clock signal.

39. The counter circuit of claim 38 wherein the first, second, third and fourth clock signals include transitions from a first state to a second state at respective quarter-period intervals of the input clock signal.

40. The counter circuit assembly of claim 39 wherein each of the registers includes:

a first switching circuit having a supply voltage terminal for receiving a supply voltage, first and second clock signal inputs coupled to the first and second clock output terminals, and a first switching voltage output terminal, the first switching circuit being responsive to the transitions of the first and second clock signals to couple the supply voltage terminal to the first switching output terminal;

a first isolation circuit coupled between the first switching output terminal and the bit output terminal, the first isolation circuit having a first control input and being responsive to a first control signal to isolate the first switching output terminal from the bit output terminal;

a second switching circuit having a reference voltage terminal for coupling to a reference potential, third and fourth clock signal inputs coupled to the third and fourth clock output terminals, and a second switching voltage output terminal, the second switching circuit being responsive to the transitions of the third and fourth clock signals to couple the reference voltage terminal to the second switching output terminal; and a second isolation circuit coupled between the second switching output terminal and the bit output terminal, the second isolation circuit having a second control input and being responsive to a second control signal to isolate the second switching output terminal from the bit output terminal.

41. A memory device, comprising:

a command input terminal for receiving input commands;

a clock input terminal for receiving an input clock signal;

a memory array;

input/output circuitry coupled to the memory array;

a clock converter having a converter input terminal and first and second clock output terminals, the clock converter being responsive to the input clock signal to produce a first clock signal at the first clock output terminal having a transition during a cycle of the input clock signal and a second clock signal having a transition spaced apart from the transition of the first clock signal by one quarter of a clock cycle;

a counter circuit having a first clock input coupled to the first clock output terminal, a second clock input coupled to the second clock output terminal, and a counter output terminal, the counter circuit being responsive to the first transition to provide a first counter bit of a first state and responsive to the second transition to provide the first counter bit of a second state; and a command generator circuit having a command input coupled to the command input terminal and a timing control input coupled to the counter output terminal, the command generator being responsive to the input commands to activate the input/output circuitry at selected counts from the counter circuit.

42. The memory device of claim 41 wherein the command generator is responsive to packetized data.

43. The memory device of claim 41 wherein the memory device is a dynamic random access memory.

44. The memory device of claim 43 wherein the command generator is responsive to packetized data.

45. The memory device of claim 41 wherein the counter circuit includes:

a least significant bit register having an LSB output terminal, an LSB control input terminal and an LSB clock input terminal for receiving the clock signal, the least significant bit register being responsive to produce a least significant bit at the LSB output terminal in response to the clock signal at the clock input terminal;

a plurality of more significant bit counter circuits, each more significant bit counter circuit including:
 a bit output terminal;
 a first counter input terminal coupled to an output terminal of a preceding counter circuit;
 an LSB input terminal;
 a combining logic circuit having a first logic input coupled to the bit output terminal, a second logic input coupled to the LSB input terminal, a third logic input coupled to the first counter input terminal, and a logic output terminal, the combining logic circuit being configured to provide a logic output signal in response to logic signals at the first and second logic inputs; and a bit register having a more significant bit output coupled to the bit output terminal and a first control input coupled to the logic output terminal, the bit register being responsive to provide a more significant bit to the bit output terminal in response to the logic output signal; and a bypass circuit coupled between the LSB output terminal and the LSB input terminals.

46. The memory device of claim 45 wherein the LSB control input terminal is connected directly to the LSB output terminal.

47. The memory device of claim 45 wherein each of the logic circuits has a first response time to a signal at the first logic input, a second response time to a signal at the second logic input, and has a third response time to a signal at the third logic input, wherein the first response time is shorter than the second response time or the third response time.

48. A computer system, comprising:

a processor;

an input device;

an output device;

a processor coupled to the input device and the output device, the processor having a command output terminal, a clock output terminal and a data input terminal; and a memory device, including:

a command input terminal coupled to the command output terminal for receiving commands from the processor;

a clock input terminal coupled to the clock output terminal for receiving an input clock signal;

a memory array;

a clock circuit coupled to the clock input terminal, the clock circuit having a local clock output;

a counter including an input stage having a counter output terminal, a first switching section, a second switching section, a first isolation switch coupled between the first switching section and the counter output terminal, a second isolation switch coupled between the second switching section and the counter output terminal, each of the switching sections having a respective clocking input coupled to the clock circuit, each of the isolation switches having a respective isolation input and being responsive to selectively isolate the respective switching section from the counter output terminal in response to an isolation signal at the isolation input; and reading circuitry coupled to the memory array and the counter, the reading circuitry being responsive to the count signal to transfer data to or from the memory array.

49. The computer system of claim 48 wherein the local clock signal includes a plurality of asymmetric signals and wherein the clock circuit includes a clock converter having a converter input terminal and first and second clock output terminals, the clock converter being responsive to the input clock signal to produce a first asymmetric signal at the first clock output terminal having a transition during a cycle of the local clock signal and a second asymmetric signal having a transition spaced apart from the transition of the first asymmetric signal by one quarter of the cycle of the local clock signal.

50. A method of toggling a selected bit of a count having a plurality of less significant bits with a selected stage of a counter, the counter having a plurality of other stages corresponding to the less significant bits, the method comprising the steps of:

providing a clock signal to the selected stage and the plurality of other stages;

producing the plurality of less significant bits with the plurality of other stages;

varying the states of the less significant bits in response to the clock signal;

receiving the less significant bits with a logic circuit;

on a first clock cycle, determining with the logic circuit if all of the states of the plurality of bits are the same;

enabling toggling of the selected stage in response to the step of determining with the logic circuit if all of the states of the plurality of bits are the same; and on a second clock cycle immediately after the first clock cycle, toggling the selected register in response to an edge of the clock signal.

51. The method of claim 50 wherein the step of toggling the selected register in response to an edge of the clock signal includes the steps of:

feeding the selected bit from the selected stage back to the logic circuit;

determining with the logic circuit the state of the selected bit;

establishing the control signal in a first state corresponding to a high transition in response to the selected bit state being low; and establishing the control signal in a first state corresponding to a low transition in response to the selected bit state being high.

52. The method of claim 50 wherein the step of providing a clock signal to the selected stage and the plurality of other stages, includes the steps of:

producing four clock components having respective transitions at quarter cycle increments of the clock signal; and supplying the four components to the selected stage and the plurality of other stages.

53. The method of claim 52 wherein the step of producing four clock components having respective transitions at quarter cycle increments of the clock signal includes producing four asymmetric clock components.

54. A method of providing a count signal having a plurality of bits, comprising the steps of:

producing a clocking signal;

providing the clocking signal to a least significant bit counter;

producing a least significant bit with the least significant bit counter in response to the clocking signal;

providing the least significant bit to a next least significant bit counter;

producing a next least significant bit with the next least significant bit counter in response to the least significant bit;

propagating the next least significant bit through a series of more significant bit counters;

providing the least significant bit directly to the more significant bit counters; and producing more significant bits with the more significant bit counters in response to the propagating next least significant bit and the least significant bit.

55. The method of claim 54, further comprising the step of combining the least significant bit, the next least significant bit and the more significant bits to produce the count signal.

56. A method of switching bits of a count signal at an output terminal between first states and second states, comprising the steps of:
   providing an output voltage of the first state with a first switching circuit;
   producing a first clock signal;
   producing a second clock signal phase shifted relative to the first clock signal;
   in response to transitions of the first clock signal, switching the output voltage from the first state to the second state with a first switching circuit;
   in response to transitions of the second clock signal, providing a voltage of a second state different from the first state with a second switching circuit;
   while performing the step of switching the output voltage from the first state to the second state with a first switching circuit, isolating the second switching circuit from the output terminal; and
   while performing the step of switching the output voltage from the second state to the first state with a second switching circuit, isolating the first switching circuit from the output terminal.

57. The method of claim 56, further comprising the steps of:
   producing a third clock signal; and
   in response to transitions of the third clock signal, providing a voltage of a second state different from the first state with the second switching circuit.

58. The method of claim 57, further comprising the steps of:
   producing a fourth clock signal phase shifted relative to the third clock signal; and
   in response to transitions of the fourth clock signal, providing the voltage of the first state with the first switching circuit.

59. A method of producing a bit of a count signal at an output node, comprising the steps of:
   providing four clock signals, each clock signal having a transition from a first state to a second state at a respective quarter period;
   periodically providing a supply voltage to the output node with a first switching circuit in response to the transitions of the first and third clock signals;
   periodically providing a reference voltage to the output node with a second switching circuit in response to the transitions of the second and fourth clock signals;
   decoupling the second switching circuit from the output node in response to the transitions of the first and third clock signals; and
   decoupling the first switching circuit from the output node in response to the transitions of the second and fourth clock signals.

60. The method of claim 59 wherein the step of providing four clock signals, each clock signal having a transition from a first state to a second state at a respective quarter period comprises the steps of:
   providing a first input clock signal;
   providing a second input clock signal phase shifted relative to the first clock signal;
   logically combining the first and second input clock signals according to a first logic combination to form the first clock signal;
   logically combining the first and second input clock signals according to a second logic combination to form the second clock signal;
   logically combining the first and second input clock signals according to a third logic combination to form the third clock signal; and
   logically combining the first and second input clock signals according to a fourth logic combination to form the fourth clock signal.

61. A method of switching bits of a count signal at an output terminal between first states and second states in response to a first clock signal having a single high going edge and a single low going edge during a clock period, comprising the steps of:
   providing a first bit having the first state or the second state;
   during a first clock period toggling the first bit from the first state to the second state in response to the high going edge;
   during the first clock period, toggling the first bit from the second state to the first state in response to the low going edge;
   providing a second bit having one of the first or second states;
   during the first clock period, detecting the state of the first bit; and
   in response to the detected state of the first bit and either of the clock edges, toggling the second bit from the one of the first or second states to the other of the first or second states.

62. The method of claim 61 further comprising the step of producing from the first clock signal a plurality of asymmetric clock signals, each asymmetric clock signal having a respective high going clock edge and a respective low going clock edge during the clock period, at least one edge of the asymmetric signals being spaced apart from the first clock signal high going edge and the first clock signal low going edge wherein the step of toggling the second bit from the one of the first or second states to the other of the first or second states is responsive to the at least one edge of the asymmetric signals spaced apart from the first clock signal high going edge and the first clock signal low going edge.

63. The method of claim 62 wherein each of the asymmetric signals has a duty cycle other than 50%.

64. The method of claim 61 further comprising the step of, producing a phase shifted clock signal in response to the first clock signal, wherein the step of toggling the second bit from the one of the first or second states to the other of the first or second states is responsive to the phase shifted clock signal.

65. The method of claim 64 further comprising the step of producing from the first clock signal and the phase shifted clock signal a plurality of asymmetric clock signals, each asymmetric clock signal having a respective high going clock edge and a respective low going clock edge during the clock period, at least one edge of the asymmetric signals being spaced apart from the first clock signal high going edge and the first clock signal low going edge wherein the step of toggling the second bit from the one of the first or second states to the other of the first or second states is responsive to the at least one edge of the asymmetric signals spaced apart from the first clock signal high going edge and the first clock signal low going edge.

* * * * *

UNITED STATES PATENT AND TRADEMARK OFFICE
CERTIFICATE OF CORRECTION

PATENT NO. : 5,956,502
DATED : September 21, 1999
INVENTOR(S) : Troy A. Manning

It is certified that error appears in the above-identified patent and that said Letters Patent is hereby corrected as shown below:

Column 5,
Line 65, "CLKO" should read -- CLKO* --

Column 10,
Line 34, "2nd" should read -- first --

Column 16,
Line 29, "out put" should read -- output --

Signed and Sealed this

Twenty-fifth Day of September, 2001

*Attest:*

NICHOLAS P. GODICI
*Attesting Officer*     *Acting Director of the United States Patent and Trademark Office*